(12) United States Patent
Otsuka et al.

(10) Patent No.: US 9,302,473 B2
(45) Date of Patent: Apr. 5, 2016

(54) LIQUID DISCHARGE APPARATUS, HEAD UNIT, AND CONTROL METHOD OF LIQUID DISCHARGE APPARATUS

(71) Applicant: Seiko Epson Corporation, Tokyo (JP)

(72) Inventors: Shuji Otsuka, Shiojiri (JP); Tadashi Kiyuna, Hachioji (JP); Toshifumi Asanuma, Hamura (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/595,460

(22) Filed: Jan. 13, 2015

(65) Prior Publication Data

US 2015/0197084 A1 Jul. 16, 2015

(30) Foreign Application Priority Data

Jan. 16, 2014 (JP) ................................ 2014-005664

(51) Int. Cl.
*B41J 29/38* (2006.01)
*B41J 2/045* (2006.01)

(52) U.S. Cl.
CPC ............ *B41J 2/04548* (2013.01); *B41J 2/0452* (2013.01); *B41J 2/0455* (2013.01); *B41J 2/0459* (2013.01); *B41J 2/04541* (2013.01); *B41J 2/04581* (2013.01); *B41J 2/04588* (2013.01)

(58) Field of Classification Search
CPC .................................................. B41J 2/04548
See application file for complete search history.

(56) References Cited

U.S. PATENT DOCUMENTS

| 7,852,128 B2 | 12/2010 | Kitazawa et al. |
| 2009/0189453 A1* | 7/2009 | Kitazawa ............... B41J 2/0452 307/71 |
| 2010/0103212 A1* | 4/2010 | Tabata et al. .................... 347/10 |
| 2011/0018919 A1* | 1/2011 | Oshima et al. .................... 347/9 |

FOREIGN PATENT DOCUMENTS

| JP | 2004-153411 A | 5/2004 |
| JP | 2009-190287 A | 8/2009 |
| JP | 2010-114711 A | 5/2010 |
| JP | 2011016285 A * | 1/2011 |

* cited by examiner

*Primary Examiner* — Shelby Fidler
(74) *Attorney, Agent, or Firm* — Harness, Dickey & Pierce, P.L.C.

(57) ABSTRACT

A liquid discharge apparatus includes: a piezoelectric element that is displaced according to a voltage of a drive signal; a cavity which is filled with a liquid and of which an inside volume is changed due to the displacement of the piezoelectric element; a nozzle that communicates with the cavity and is capable of discharging the liquid; a charge source that supplies a charge to the piezoelectric element; and a connection path selecting section that causes the piezoelectric element and the charge source to be electrically connected to each other by using a first signal path or a second signal path. The charge source includes: a first auxiliary power source that outputs two types or more of voltages; and a second auxiliary power source that outputs three types or more of voltages by using the two types or more of voltages output from the first auxiliary power source.

7 Claims, 31 Drawing Sheets

FIRST SECTION

SECOND SECTION

FIG. 10A ⟨LEVEL SHIFTER 36a⟩
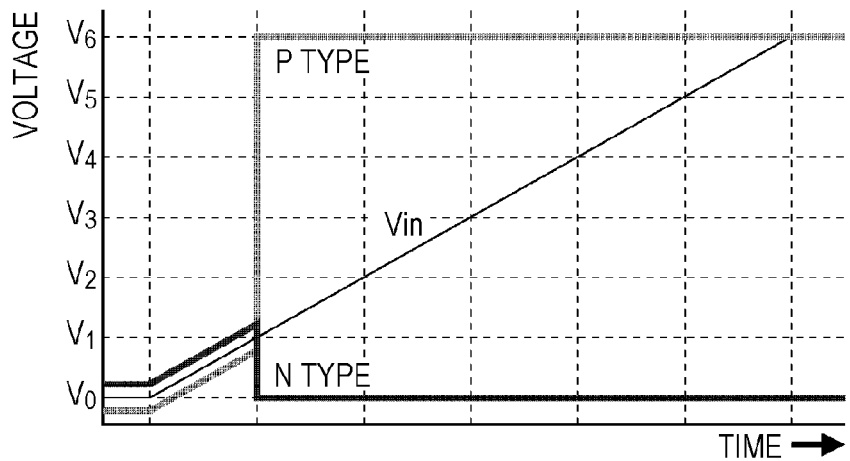
FIG. 10B ⟨LEVEL SHIFTER 36b⟩
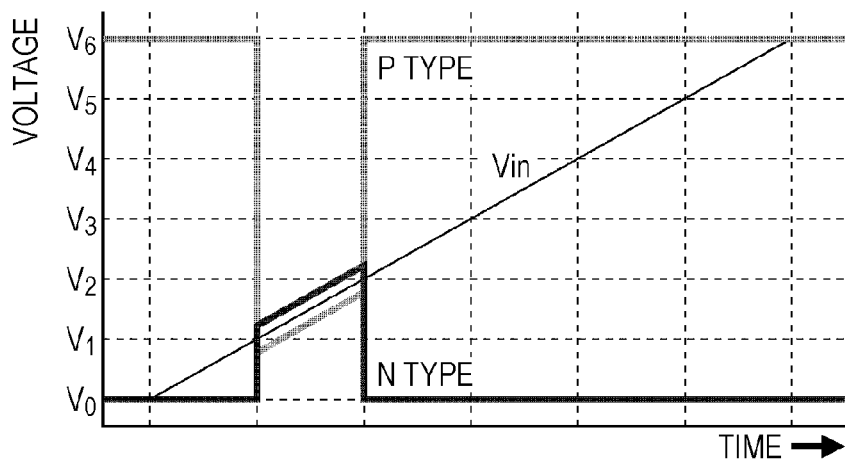
FIG. 10C ⟨LEVEL SHIFTER 36f⟩
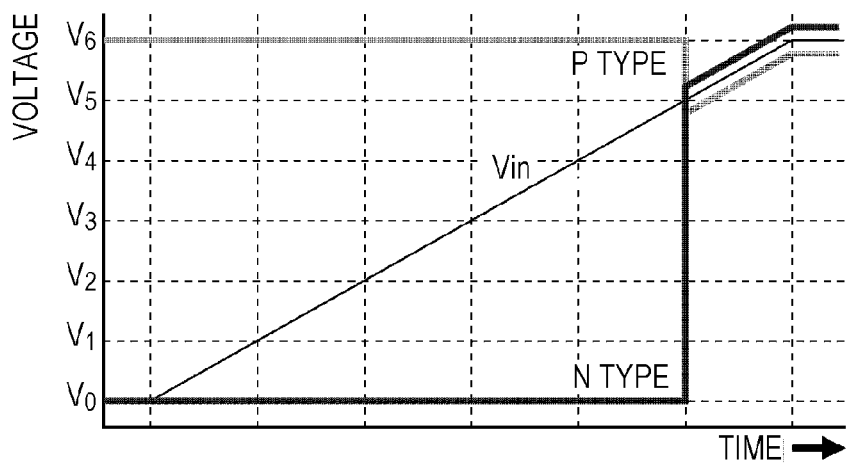

FIG. 11 <FIRST STATUS: CHARGE>
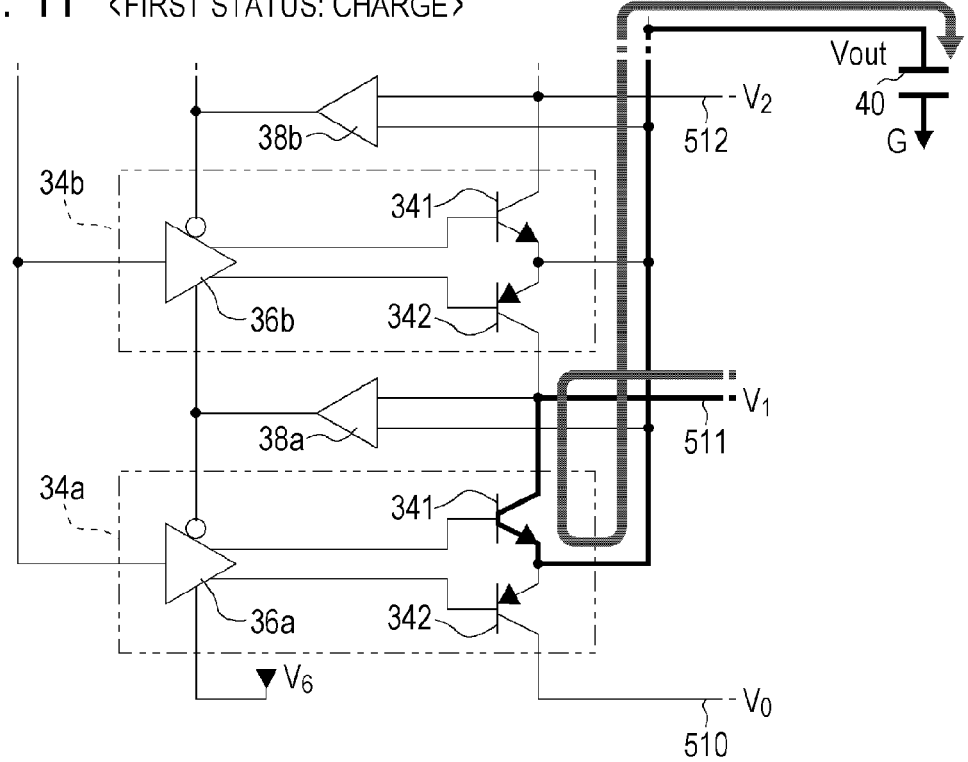
FIG. 12 <SECOND STATUS: CHARGE>
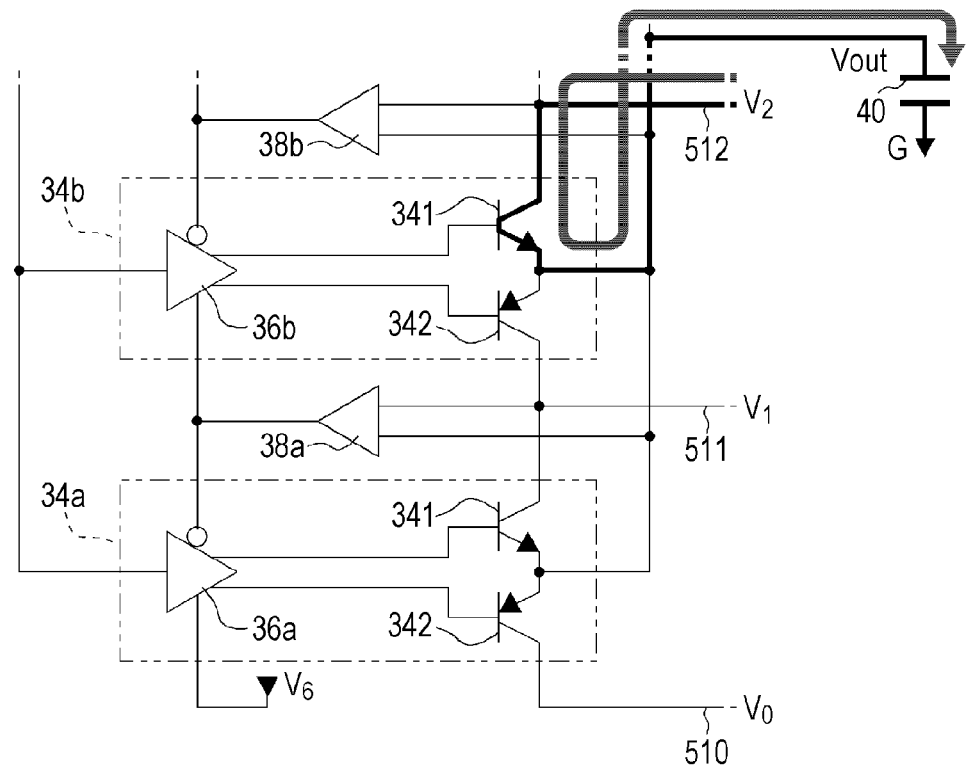

FIG. 13 <SECOND STATUS: DISCHARGE>
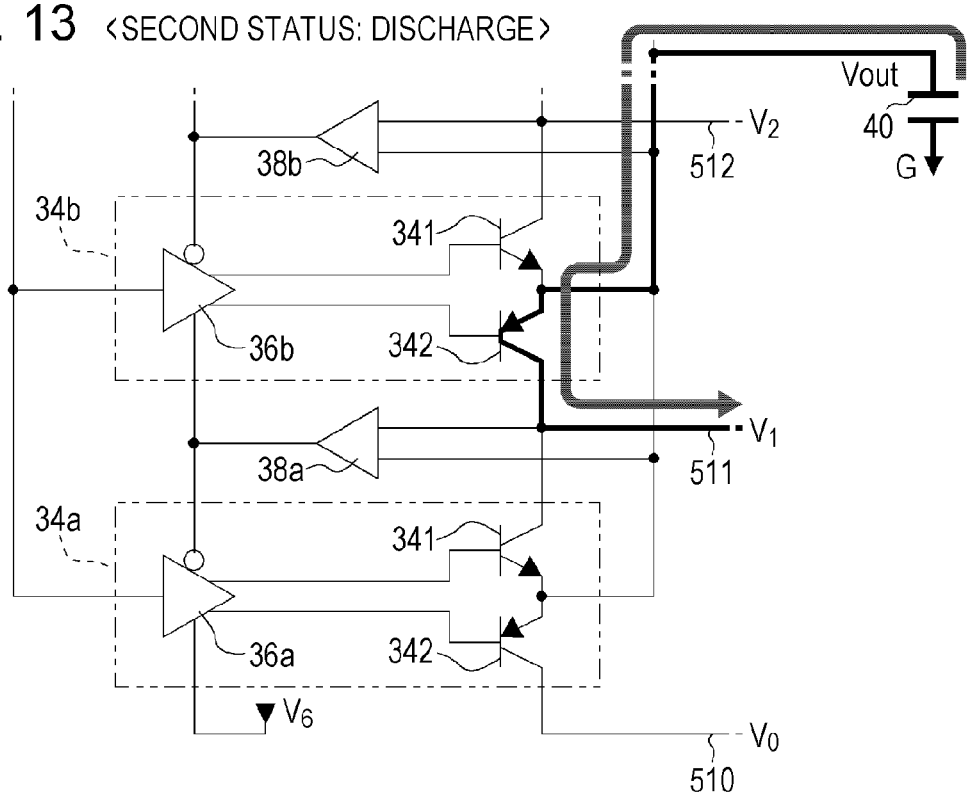
FIG. 14 <FIRST STATUS: DISCHARGE>
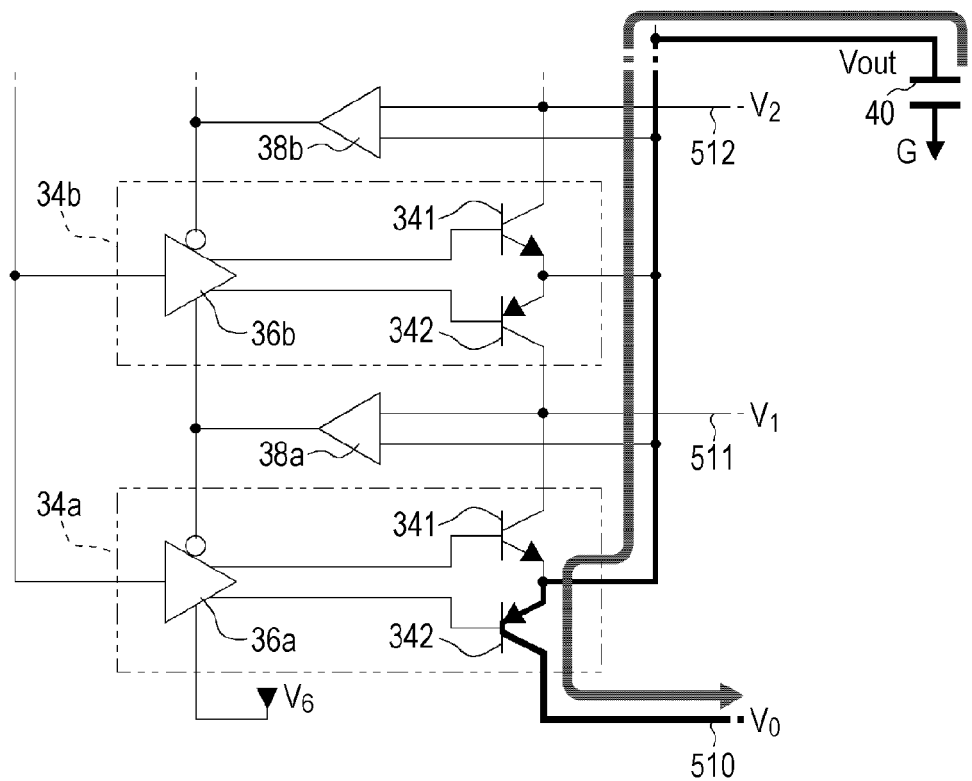

<STATUS A (SELECTION OF TERMINAL a)>

<STATUS B (SELECTION OF TERMINAL b)>

⟨STATUS A (SELECTION OF TERMINAL a)⟩

⟨STATUS B (SELECTION OF TERMINAL b)⟩

<PRESENT EMBODIMENT>

<COMPARATIVE EXAMPLE 1>

<COMPARATIVE EXAMPLE 2>

FIRST SECTION

SECOND SECTION

THIRD SECTION

FOURTH SECTION

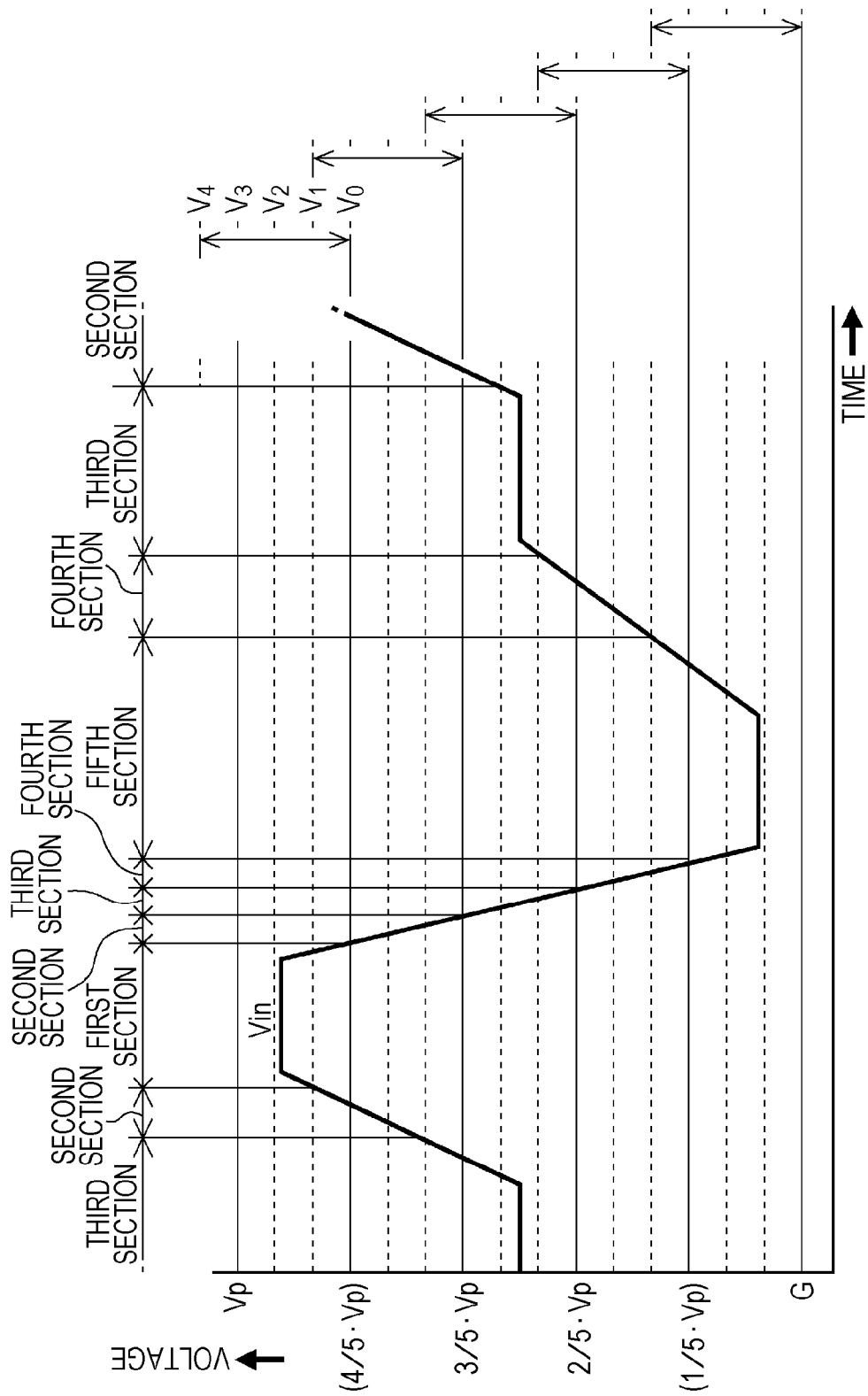

FIRST SECTION

SECOND SECTION

THIRD SECTION

FOURTH SECTION

FIFTH SECTION

⟨STATUS A (SELECTION OF TERMINAL a)⟩

⟨STATUS B (SELECTION OF TERMINAL b)⟩

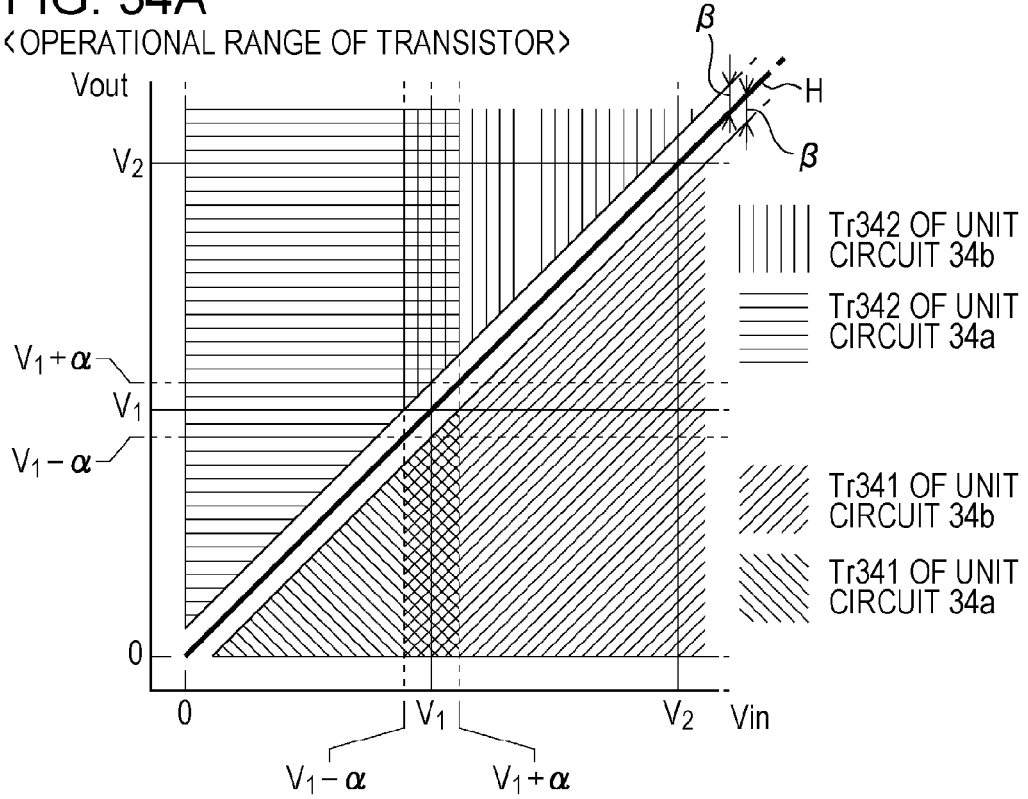
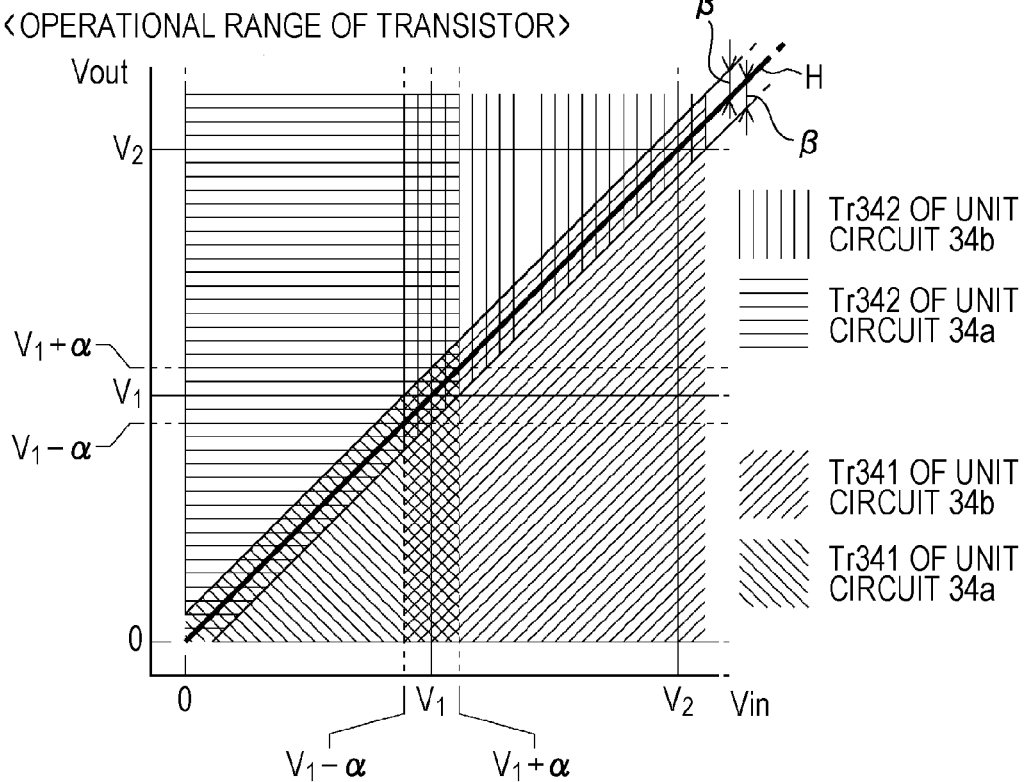

LIQUID DISCHARGE APPARATUS, HEAD UNIT, AND CONTROL METHOD OF LIQUID DISCHARGE APPARATUS

The entire disclosure of Japanese Patent Application No. 2014-005664, filed Jan. 16, 2014 is expressly incorporated by reference herein.

BACKGROUND

1. Technical Field

The present invention relates to a liquid discharge apparatus, a head unit, and a control method of the liquid discharge apparatus.

2. Related Art

As an ink jet printer that discharges ink and prints an image or a document, a printer that uses piezoelectric elements (for example, piezo element) is known. The piezoelectric elements are provided respectively corresponding to a plurality of nozzles in a head unit (print head) and are respectively driven in accordance with drive signals and thereby a predetermined amount of ink (liquid) is discharged from the nozzles at a predetermined timing. The piezoelectric element is a capacitive load like a capacitor in terms of electric power. Therefore, a sufficient current is needed to operate the piezoelectric element of the nozzle.

Therefore, in the related art, a configuration is known, in which an original signal of the drive signal is amplified by using an amplifier circuit and the amplified drive signal is supplied to the head unit such that the piezoelectric element is driven. Examples of the amplifier circuit includes a system of performing current amplification of the original signal by using a class AB amplifier or the like (linear amplification, see JPA-2009-190287) or a system of demodulating by using a low pass filter after pulse width modulation, pulse density modulation, or the like of the original signal (class D amplification, see JP-A-2010-114711). In addition, a system of switching a voltage that is applied to a piezoelectric element (voltage switching system, see JP-A-2004-153411) is also proposed, in addition to a configuration in which the original signal is amplified by using the amplifier circuit.

However, the linear amplification results in high power consumption and poor energy efficiency. The class D amplification is higher in energy efficiency compared to the linear amplification, but has a problem of an occurrence of electromagnetic interference (EMI) by switching a high current at a high frequency. In addition, in the simple voltage switching system described above, power saving is achieved to some extent, but still has to be improved.

SUMMARY

An advantage of some aspects of the invention is to provide a liquid discharge apparatus in which energy efficiency is high, an occurrence of EMI is suppressed, and power consumption is improved, a head unit, and a control method of the liquid discharge apparatus.

In order to achieve the advantage described above, a liquid discharge apparatus according to an aspect of the invention includes: a piezoelectric element that is displaced according to a voltage of a drive signal; a cavity which is filled with a liquid and of which an inside volume is expanded and contracted due to the displacement of the piezoelectric element; a nozzle that communicates with the cavity and is capable of discharging the liquid by the expansion and contraction of the inside volume of the cavity; a charge source that supplies a charge to the piezoelectric element; a first signal path to which a first voltage is applied by the charge source; a second signal path to which a second voltage that is higher than the first voltage is applied by the charge source; and a connection path selecting section that causes the piezoelectric element and the charge source to be electrically connected to each other by using the first signal path or the second signal path according to the voltage of a control signal that controls the voltage of the drive signal and a hold voltage of the piezoelectric element. The charge source includes: a first auxiliary power source that outputs two types or more of voltages; and a second auxiliary power source that outputs three types or more of voltages which is used to be applied to the piezoelectric element by using the two types or more of voltages output from the first auxiliary power source.

In the liquid discharge apparatus according to the aspect, the connection path selecting section causes the piezoelectric element and the charge source to be electrically connected to each other by using the first signal path or the second signal path, and thereby the piezoelectric element is charged and discharged. Since the charge and the discharge are performed in a stepwise manner, it is possible to achieve a high energy efficiency compared to a configuration in the related art in which the charge or the discharge between power supply voltages is performed at once. In addition, in the charge source, since the second auxiliary power source outputs more voltages by using the voltage output from the first auxiliary power source, it is possible to increase the number of voltage divisions used when the drive signal is supplied to the piezoelectric element.

In the liquid discharge apparatus according to the aspect, the first auxiliary power source may include: m (m is a plural number) capacitive elements; and a first switching section that switches between a series status in which the m capacitive elements are electrically connected in series and a parallel status in which the m capacitive elements are electrically connected in parallel. The second auxiliary power source may include: n (n is a plural number) capacitive elements; and a second switching section that switches between a series status in which the n capacitive elements are electrically connected in series and a parallel status in which the n capacitive elements are electrically connected in parallel.

In this configuration, it is possible to match the intervals of the two types or more of voltages output from the first auxiliary power source. In addition, it is possible to match the intervals of the three types or more of voltages output from the second auxiliary power source.

According to the configuration, in the second auxiliary power source in the series status, any first point of connection points of the n capacitive elements to one another may be connected to the first signal path and a second point on the higher side than the first point of the connection points of the n capacitive elements to one another may be connected to the second signal path. Since the charge collected through the first signal path is distributed by the parallel connection of the m capacitive elements and is supplied to and reused by the first signal path and the second signal path by the series connection, it is possible to suppress power consumption.

According to the configuration, the first auxiliary power source may be configured to supply, to the second auxiliary power source, at least one of a higher-side voltage set in which a higher side has an A voltage and a lower-side voltage set in which the higher side has a B voltage that is lower than the A voltage. The A voltage and the B voltage are just nominal labels to distinguish the voltages from each other.

According to the configuration, the first auxiliary power source may be configured to supply, to the second auxiliary power source, the higher-side voltage set in a case where the voltage of the drive signal is a first drive voltage and the lower-side voltage set in a case where the voltage of the drive signal is a second drive voltage which is lower than the first drive voltage. In this configuration, the voltage sets that the first auxiliary power source supplies to the second auxiliary power source are switched according to the voltage of the drive signal that is applied to the piezoelectric element. The voltage sets are switched according to the voltage of the drive signal, which is performed with a hysteresis characteristic.

According to the configuration, a third drive voltage which is lower than the first drive voltage and higher than the second drive voltage may be included both in a voltage range of the higher-side voltage set and in a voltage range of the lower-side voltage set. In the configuration, since there is a range in which the voltage range of the higher-side voltage set and the voltage range of the lower-side voltage set are overlapped, it is possible to suppress reduction of a following property of the voltage of a signal (drive signal) which is applied to the piezoelectric element, to a control voltage.

The invention can be realized in various aspects such as a control method of the liquid discharge apparatus or a single head unit.

BRIEF DESCRIPTION OF THE DRAWINGS

The invention will be described with reference to the accompanying drawings, wherein like numbers reference like elements.

FIGS. 10A, 10B, and 10C are diagrams illustrating examples of relationships between inputs and outputs in the level shifter.

FIG. 11 is a diagram illustrating flow of a current (charge) in the driver.

FIG. 12 is a diagram illustrating flow of the current (charge) in the driver.

FIG. 13 is a diagram illustrating flow of the current (charge) in the driver.

FIG. 14 is a diagram illustrating flow of the current (charge) in the driver.

FIG. 27 is a diagram illustrating an operation or the like of the auxiliary power supply circuit according to Application Example (2).

FIGS. 34A and 34B are diagrams illustrating operational ranges of transistors according to Application Example (3).

DESCRIPTION OF EXEMPLARY EMBODIMENTS

Hereinafter, embodiments according to the invention will be described with reference to the drawings.

Entire Configuration of Printing Apparatus

A printing apparatus according to the embodiment is an ink jet printer, that is, a liquid discharge apparatus, which discharges ink according to image data supplied from a host computer such that an ink dot group is formed on a printing medium such as paper, and thereby prints an image (including a text, a figure, or the like) in accordance with the image data.

Figure 1:
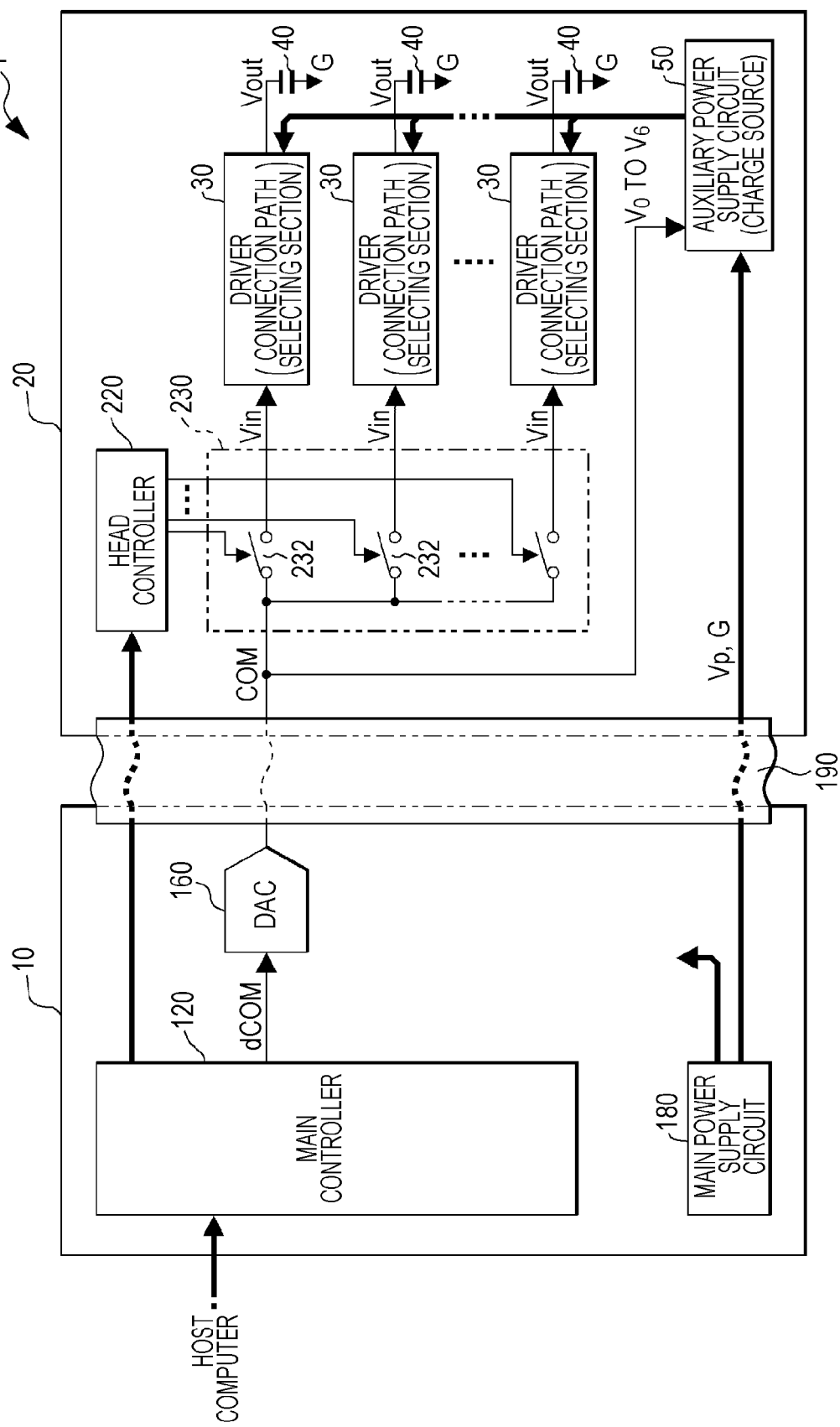
FIG. 1 is a diagram schematically illustrating a configuration of a control unit and a head unit of a printing apparatus.

FIG. 1 is a diagram schematically illustrating a configuration of a printing apparatus 1.

As illustrated in FIG. 1, the printing apparatus 1 is configured to have a control unit 10 that executes a computing process for printing an image on the basis of the image data supplied from the host computer and a head unit 20 that has a plurality of nozzles. The control unit 10 and the head unit 20 are electrically connected through a flexible cable 190. In addition, the head unit 20 is mounted on a carriage (not illustrated) which is movable in a direction (main scanning direction) substantially orthogonal to a feed direction (sub scanning direction) of the print medium.

The control unit 10 includes a main controller 120, a digital to analog converter (DAC) 160, and a main power supply circuit 180.

The main controller 120 executes a computing color conversion process, ink color separating process, or a halftone process on the basis of the image data acquired from the host computer and generates a plurality of types of signals for causing the ink to be discharged from a nozzle of the head unit 20. The plurality of types of signals include digital control data dCOM which is supplied from the DAC 160, or various signals to be supplied to a head controller 220 which will be described later.

Details of each computing process for printing which is executed by the main controller 120 may be executed by the host computer in some cases. The details of the computing process are so well known in the technical field of the printing apparatus that a description thereof is omitted.

In addition, as for the printing apparatus 1, a carriage motor to move a carriage mounted on the head unit in the main scanning direction, a transport motor for transporting the printing medium in the sub scanning direction, and the like are included, and as for the control unit 10, a configuration of supplying drive signals to these motors are included, but similarly, these are so well known that a description thereof is omitted.

The DAC 160 converts the control data dCOM into an analog control signal COM and supplies the converted signal to the head unit 20.

The main power supply circuit 180 supplies a power supply voltage to each component of the control unit 10 or to the head unit 20 and particularly supplies Vp and G as the power supply voltage to the head unit 20.

G (ground) is ground potential, and is a reference of a zero voltage, as long as there is no specific description. In addition, the voltage Vp is on the higher side than the ground G according to the embodiment.

One or a plurality of color inks is supplied to the head unit 20 from an ink container through a flow path, which is not illustrated specifically. The head unit 20 includes a plurality of sets of drivers 30 and piezoelectric elements (piezo element) 40, in addition to an auxiliary power supply circuit (charge source) 50, the head controller 220, and the selection section 230.

The auxiliary power supply circuit 50 generates voltages $V_0$ to $V_6$ by using the power supply voltages Vp and G by the main power supply circuit 180 and supplies the voltages to the plurality of drivers 30, in common. A configuration of the auxiliary power supply circuit 150 will be described in detail, but each of the voltages $V_0$ to $V_6$ is not constant normally according to the present embodiment and is configured to be switched according to the voltage of the control signal COM.

The head controller 220 controls selection of the selection section 230 in accordance with various signals supplied from the main controller 120.

The selection sections 230 have switches 232 respectively corresponding to the plurality of sets of drivers 30 and piezoelectric elements 40. While one ends of the switches 232 are connected to one another and are supplied with the control signal COM in common, the other ends are connected to the corresponding input ends of the drivers 30. Each switch 232 switches between ON/OFF in accordance with the control by the head controller 220 and supplies the control signal COM to the driver 30 during the ON state, and cuts off the control signal COM during the OFF state. Therefore, the selection section 230 selects the control signal COM supplied from the control unit 10 in accordance with the head controller 220 and supplies the selected signal to the driver 30.

For the convenience of description, a control signal selected in accordance with the head controller 220 and supplied to the driver 30 among the control signals COM is described as Vin.

The driver 30 outputs a drive signal of a voltage Vout in accordance with the control signal Vin which is supplied from the selection section 230 by using the voltages $V_0$ to $V_6$ which are supplied from the auxiliary power supply circuit 50 and drives the piezoelectric element 40.

One end of the piezoelectric element 40 is connected to an output end of the corresponding driver 30 and the other end of the piezoelectric element 40 is connected in common to a ground G.

As described above, the piezoelectric element 40 is provided to correspond to each of the plurality of nozzles in the head unit 20 and causes the ink to be discharged by the driving. Next, a configuration for discharging the ink by driving the piezoelectric element 40 will be described concisely.

Figure 2:
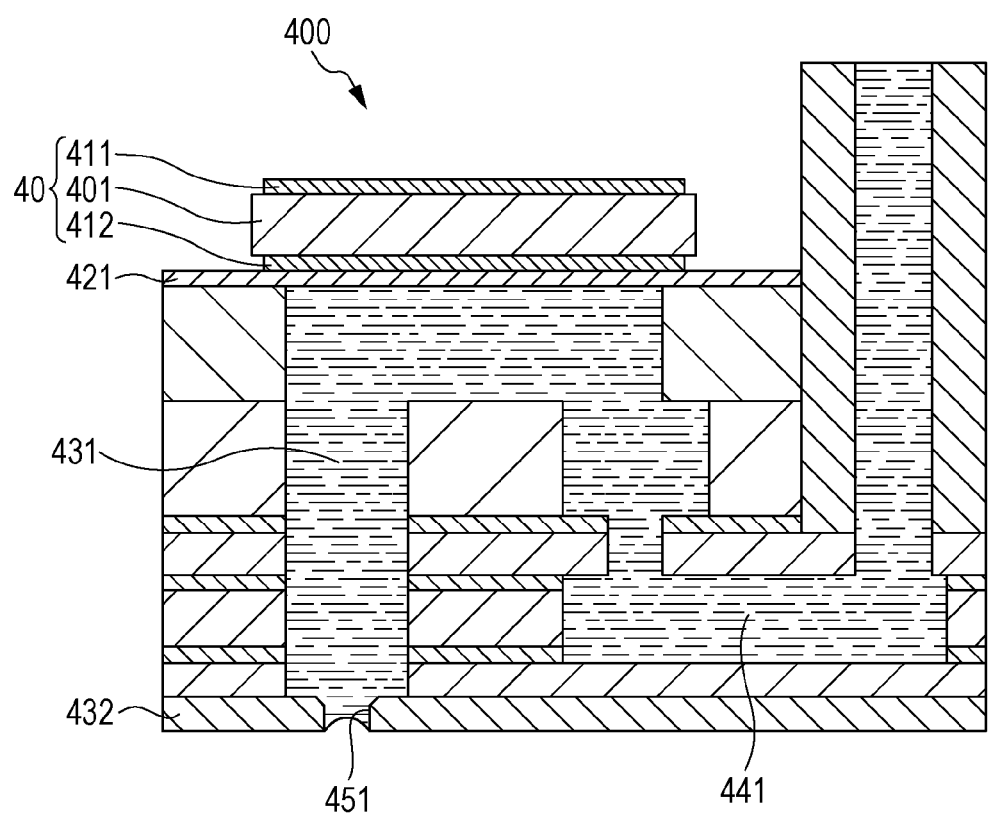
FIG. 2 is a view illustrating a configuration of a discharge section in the head unit.

FIG. 2 is a view schematically illustrating a configuration of a discharge section 400 corresponding to one nozzle in the head unit 20.

As illustrated in FIG. 2, the discharge section 400 includes the piezoelectric element 40, a vibration plate 421, a cavity (pressure chamber) 431, a reservoir 441, and a nozzle 451. The vibration plate 421 is deformed (flexurally vibrated) by the piezoelectric element 40 provided on the top surface in FIG. 2 and causes an inside volume of the cavity 431 which is filled with the ink to expand/contract. The nozzle 451 is provided in a nozzle plate 432 and is an opening through which communication to the cavity 431 is performed.

The piezoelectric element 40 illustrated in FIG. 2 is called a unimorph (monomorph) type in general and has a configuration in which a piezoelectric body 401 is interposed between a pair of electrodes 411 and 412. The central portion of the piezoelectric body 401 with the configuration is bent in the vertical direction with respect to both end portions in FIG. 2 according to the voltage applied between the electrodes 411 and 412 along with the electrodes 411 and 412 and the vibration plate 421. Here, the upward bending causes the inside volume of the cavity 431 to expand, and thus the ink is caused to be gathered from the reservoir 441 and the downward bending causes the inside volume of the cavity 431 to contract, and thus the ink is caused to be discharged from the nozzle 451.

The piezoelectric element 40 is not limited to the unimorph type, but may be a type such as a bimorph type or a stacked type, as long as the piezoelectric element 40 is caused to deform such that a liquid such as ink can be discharged. In addition, the piezoelectric element 40 is not limited to a configuration of the flexural vibration, but may have a configuration of longitudinal vibration.

Figure 3:
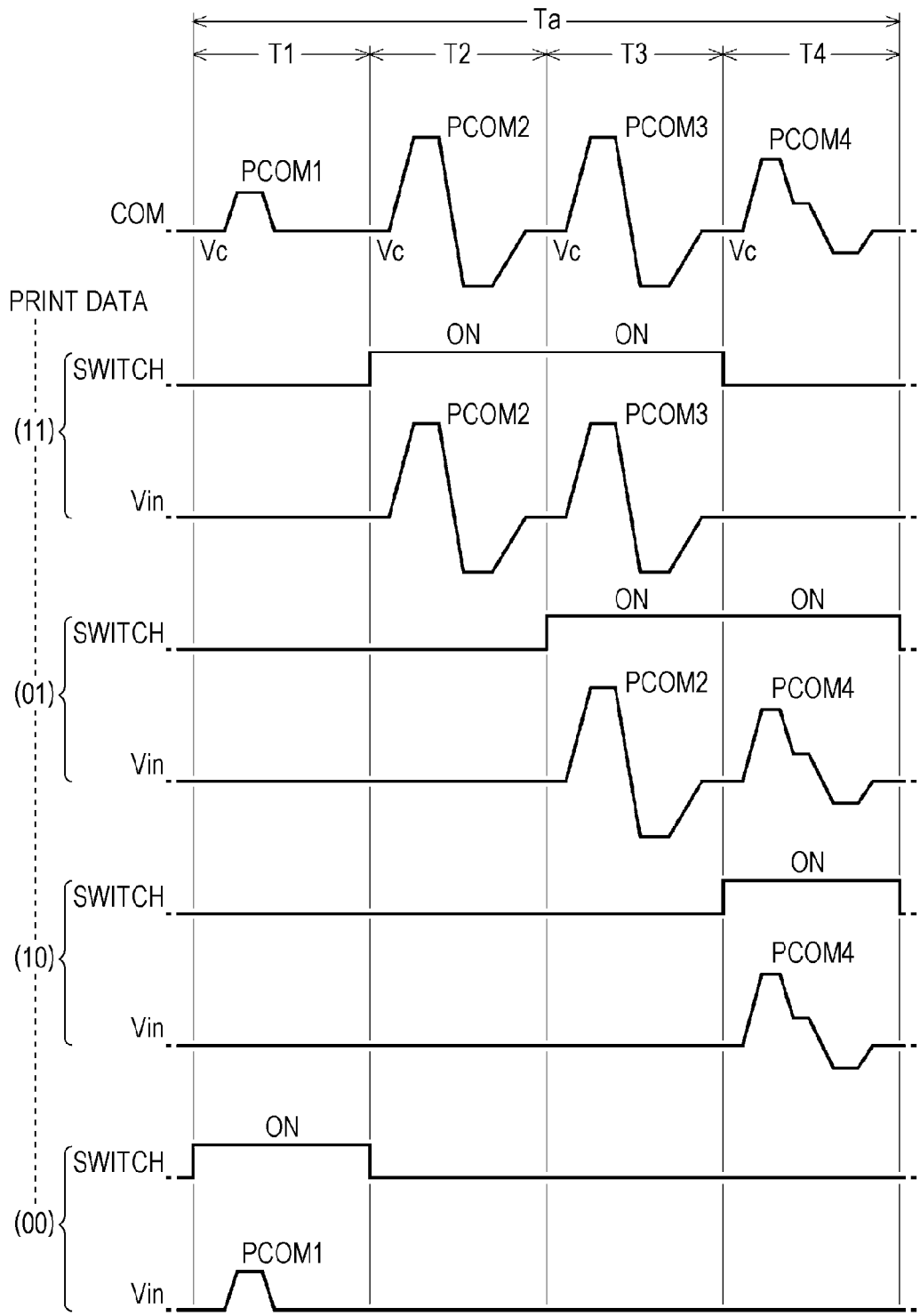
FIG. 3 is a waveform diagram illustrating an example of a control signal COM which is supplied to the head unit.

FIG. 3 is a diagram illustrating an example of a control signal COM which is supplied to the head unit 20.

As illustrated in FIG. 3, the control signal COM has a waveform which is continuous from a waveform (trapezoidal waveform) pattern PCOM1 that is the minimum unit of the signal to drive the piezoelectric element 40 to a waveform pattern PCOM4 in time series in a printing cycle Ta. The control signal COM is practically a waveform which is repeated with the printing cycle Ta as one cycle.

In the printing cycle Ta, the waveform pattern PCOM1 is positioned in a first period T1, the waveform pattern PCOM2 is positioned in a second period T2, the waveform pattern PCOM3 is positioned in a third period T3, and the waveform pattern PCOM4 is positioned in a fourth period T4.

The waveform patterns PCOM1 to PCOM4 have a voltage Vc at the time of each start and at the time of each end.

The waveform patterns PCOM2 and PCOM3 according to the present embodiment are substantially the same as each other. When it is assumed that each of the waveforms is supplied to the piezoelectric element 40, the waveforms cause a predetermined amount, for example, substantially a medium amount of ink to be discharged from the nozzle.

To be more clear, the central portion of the piezoelectric element 40 is bent upward with respect to both the end portions in accordance with the increase of the voltage, which causes the inside volume of the cavity 431 to expand, such that the ink is gathered into the cavity 431, whereas the central portion of the piezoelectric element 40 is bent downward with respect to both the end portions in accordance with the drop of the voltage, which causes the inside volume of the cavity 431 to contract, such that the ink is discharged from the nozzle 451.

In addition, the waveform pattern PCOM4 is a waveform different from the waveform pattern PCOM2 (PCOM3). When it is assumed that the waveform pattern PCOM4 is supplied to the piezoelectric element 40, the waveform cause an amount of ink less than the predetermined amount to be discharged from the nozzle.

The waveform pattern PCOM1 is a waveform for causing the ink in the vicinity of the opening of the nozzle to vibrate minutely and thus preventing the viscosity of the ink from increasing. Therefore, even though the waveform pattern PCOM1 is supplied to the piezoelectric element 40, no ink droplets are discharged from the nozzle.

Meanwhile, 2-bit print data that regulates an amount of ink (gradation) to be discharged from the nozzle for each pixel, a pulse that regulates a start timing of the printing cycle Ta, a pulse that regulates start timings of the periods T2, T3, and T4, or the like is supplied to the various signals that are supplied to the main controller 120.

The head controller 220 selects the control signal COM in accordance with the various signals supplied from the main controller 120 for each driver 30 as follows and supplies the selected control signal COM as the control signal Vin.

FIG. 3 illustrates how the control signal COM is selected with respect to the 2-bit print data by the head controller 220 and the selection section 230 and is supplied as the control signal Vin.

To be more specific, when the print data corresponding to a certain nozzle is, for example, (11), the head controller 220 causes the switch 232 corresponding to the nozzle to be ON in the periods T2 and T3. Therefore, the waveform patterns PCOM2 and PCOM3 are selected out of the control signals COM and become the control signal Vin. As will be described later, the driver 30 outputs the drive signal of the voltage Vout to follow the voltage of the control signal Vin and drives the piezoelectric element 40 corresponding to the nozzle. Therefore, a substantially medium amount of ink is discharged twice from the nozzles corresponding to each other. Accordingly, the inks land and combine on the printing medium, and as a result, a large dot is formed.

In addition, when the print data corresponding to a certain nozzle is (01), the head controller 220 causes the switch 232 corresponding to the nozzle to be ON in the periods T3 and T4. Therefore, since the waveform patterns PCOM3 and PCOM4 are selected out of the control signals COM and drive the piezoelectric element 40, substantially a medium and a substantially small amount of ink is discharged twice from the nozzle corresponding to each other. Accordingly, the inks are landed and combined on the printing medium, and as a result, a medium dot is formed.

meanwhile, when the print data corresponding to a certain nozzle is (10), the head controller 220 causes the switch 232 corresponding to the nozzle to be ON in the period T4. Therefore, since the waveform pattern PCOM4 is selected out of the control signals COM and drives the piezoelectric element 40, substantially a small amount of ink is discharged once from the nozzle. Accordingly, a small dot is formed.

when the print data corresponding to a certain nozzle is (00), the head controller 220 causes the switch 232 corresponding to the nozzle to be ON in the period T1. Therefore, the waveform pattern PCOM1 is selected out of the control signals COM and drives the piezoelectric element 40, but the ink in the vicinity of the opening of the nozzle in the period T1 is caused to only minutely vibrate. Accordingly, since no ink is discharged, no dot is formed on the printing medium, that is, non-recording occurs.

The control signal COM is selected according to such print data and is supplied as the control signal Vin (voltage Vout) and thereby four gradations of the large dot, the medium dot, the small dot, and the non-recording are expressed.

Such selection operations are executed concurrently for the nozzles. Further, waveforms illustrated in FIG. 3 are only examples. Practically, a combination of various waveforms prepared in advance is used according to the movement speed of a carriage, properties of the printing medium, or the like.

In addition, when the switch 232 switches to the OFF state, a feed path from the output of the selection section 230 to the input of the driver 30 is in a high impedance state. However, practically, the voltage Vc is maintained by parasitic capacitance at the time of start and end of the periods T1 to T4.

In addition, an example in which the piezoelectric element 40 is bent upward along with an increase of the voltage is described, but when the voltage to be supplied to the electrodes 411 and 412 is inverted, the piezoelectric element 40 is bent downward along with the increase of the voltage. Therefore, in a configuration in which the piezoelectric element 40 is bent downward along with the increase of the voltage, the control signals COM illustrated in the drawings have waveforms inverted with the voltage Vc as a reference.

As illustrated in FIG. 3, for example, in the period T1, the control signal Vin (voltage Vout) which is supplied to the piezoelectric element 40 corresponding to a certain nozzle is either the waveform pattern PCOM1 or the constant voltage Vc. In addition, in period T2, the control signal Vin (voltage Vout) which is supplied to the piezoelectric element 40 corresponding to a certain nozzle is either the waveform pattern PCOM2 or the constant voltage Vc.

That is, in each of the periods T1 to T4, the control signal Vin (voltage Vout) which is supplied to the piezoelectric element 40 is either the control signal COM (waveform patterns PCOM1 to PCOM4) or the constant voltage Vc.

Figure 4:
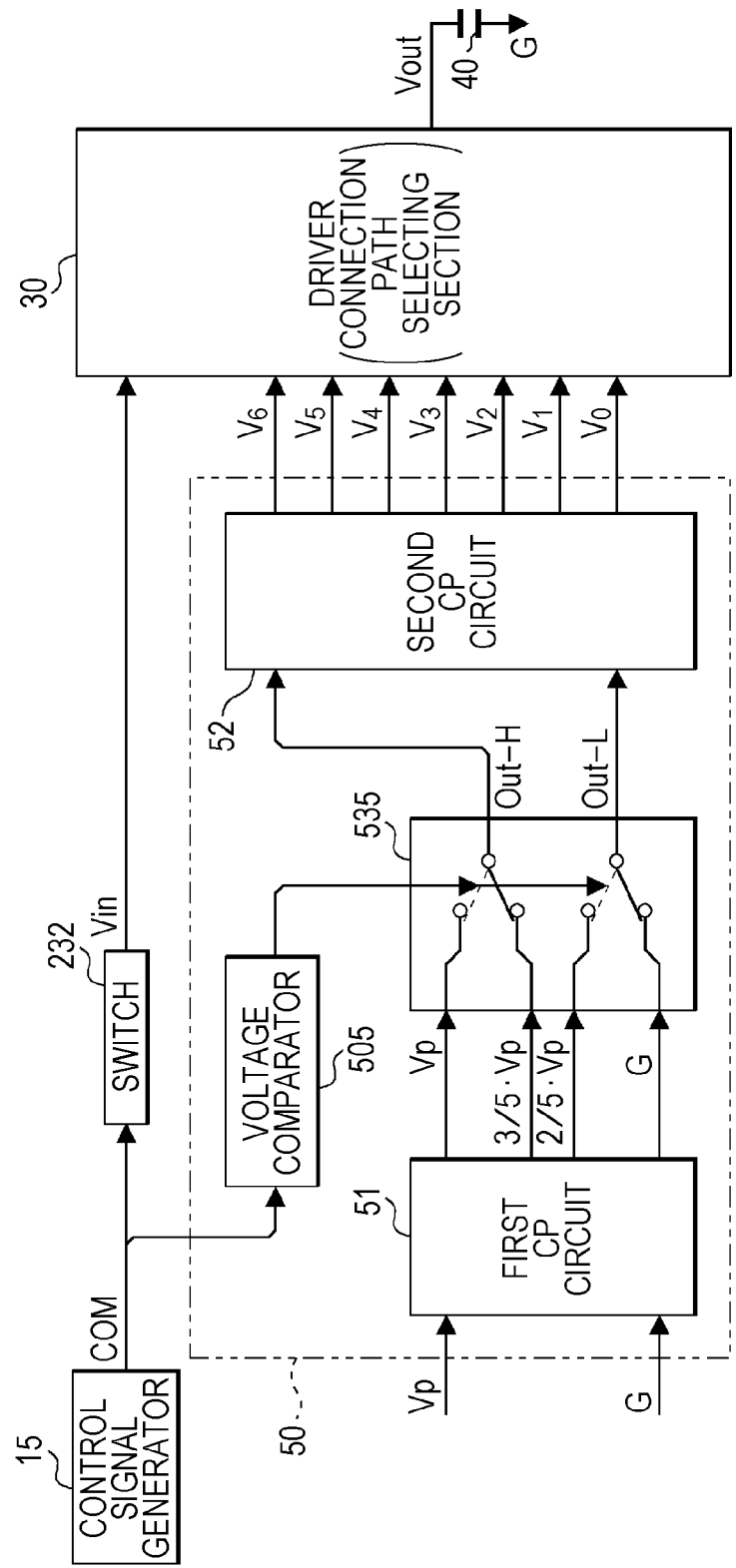
FIG. 4 is a block diagram illustrating a configuration of main components of the printing apparatus.

FIG. 4 is a block diagram illustrating a configuration of main components when focusing on a set of the driver 30 and the piezoelectric element 40 in the printing apparatus 1.

The control signal Vin that is supplied to the driver 30 may be a signal which is obtained by extracting the control signal COM converted by the DAC 160 by the ON state of the switch 232 corresponding to the driver 30, and then converting the extracted control signal COM into the voltage Vc by the OFF state of the switch 232. Therefore, FIG. 4 illustrates a configuration in which the control signal Vin is output from a control signal generator 15 with the main controller 120 and the DAC 160 as a single block.

Meanwhile, according to the present embodiment, the auxiliary power supply circuit (charge source) 50 includes a voltage comparator 505, a first CP (charge pump) circuit 51, a second CP circuit 52, and a switching device 535.

The first CP circuit 51, that is, a first auxiliary power source, causes the power supply voltages Vp and G which are supplied from the main power supply circuit 180 to be divided and redistributed by using the charge pump circuit such that voltages 4Vp/5, 3Vp/5, 2Vp/5, Vp/5 are generated.

The voltages are arranged in descending order as follows.

$$Vp > 4Vp/5 > 3Vp/5 > 2Vp/5 > Vp/5 > G$$

However, according to the present embodiment, the voltage 4Vp/5 and the voltage Vp/5 are not used, but the voltages 3Vp/5 and 2Vp/5 and the voltage Vp and G are supplied to the switching device 535.

The switching device 535 is a two-pole two-throw switch according to the present embodiment, and thus selects either of a higher-side voltage set (Vp and 2Vp/5) or a lower-side voltage set (3Vp/5 and G) by an instruction from the voltage comparator 505.

The voltage comparator 505 compares the voltage of the control signal COM and a threshold value and issues an instruction of a voltage set to be selected by the switching device 535 according to the compared result. Specifically, the voltage comparator 505 issues an instruction of selection of the higher-side voltage set (Vp and 2Vp/5) to the switching device 535 when the voltage of the control signal COM is equal to or higher than the threshold value, and issues an instruction of selection of the lower-side voltage set (3Vp/5 and G) when the voltage of the control signal COM is less than the threshold value.

However, the voltage comparator 505 has a hysteresis characteristic in the comparison of the control signal COM. Specifically, the threshold value includes a threshold value Vth-up which is used when the voltage of the control signal COM is increased and a threshold value Vth-dn which is used when dropped, and the threshold values Vth-up and Vth-dn are set to have a relationship of $$(3Vp/5>)Vth\text{-}dn(>Vp/2)>Vth\text{-}dn(>2Vp/5)$$

For the convenience of the description, of the voltage sets that are selected in the switching device 535, a terminal at which the higher-side voltage is output is written as Out-H and a terminal at which the lower-side voltage is output is written as Out-L.

In addition, since the higher-side voltage set and the lower-side voltage set are switched and output at the second CP circuit 52 by one block of the first CP circuit 51, the voltage comparator 505, and the switching device 535, it is possible to consider the one block as the first CP circuit in a broad sense.

The second CP circuit 52, that is, the second auxiliary power source divides the voltages that are output from output terminals Out-H and Out-L of the switching device 535 into six through dividing and redistribution by using the charge pump and outputs the divided voltages. To be more specific, when the voltage of the output terminal Out-H is written as $V_6$ and the voltage of the output terminal Out-L is written as $V_0$, a voltage ($V_6$-$V_0$) is divided into six and voltages $V_4$, $V_4$, $V_3$, $V_2$, and $V_1$ are output as intermediate voltages thereof in descending order.

As written in parentheses in FIG. 4, the driver 30 corresponds to a connection path selecting section.

Figure 5:
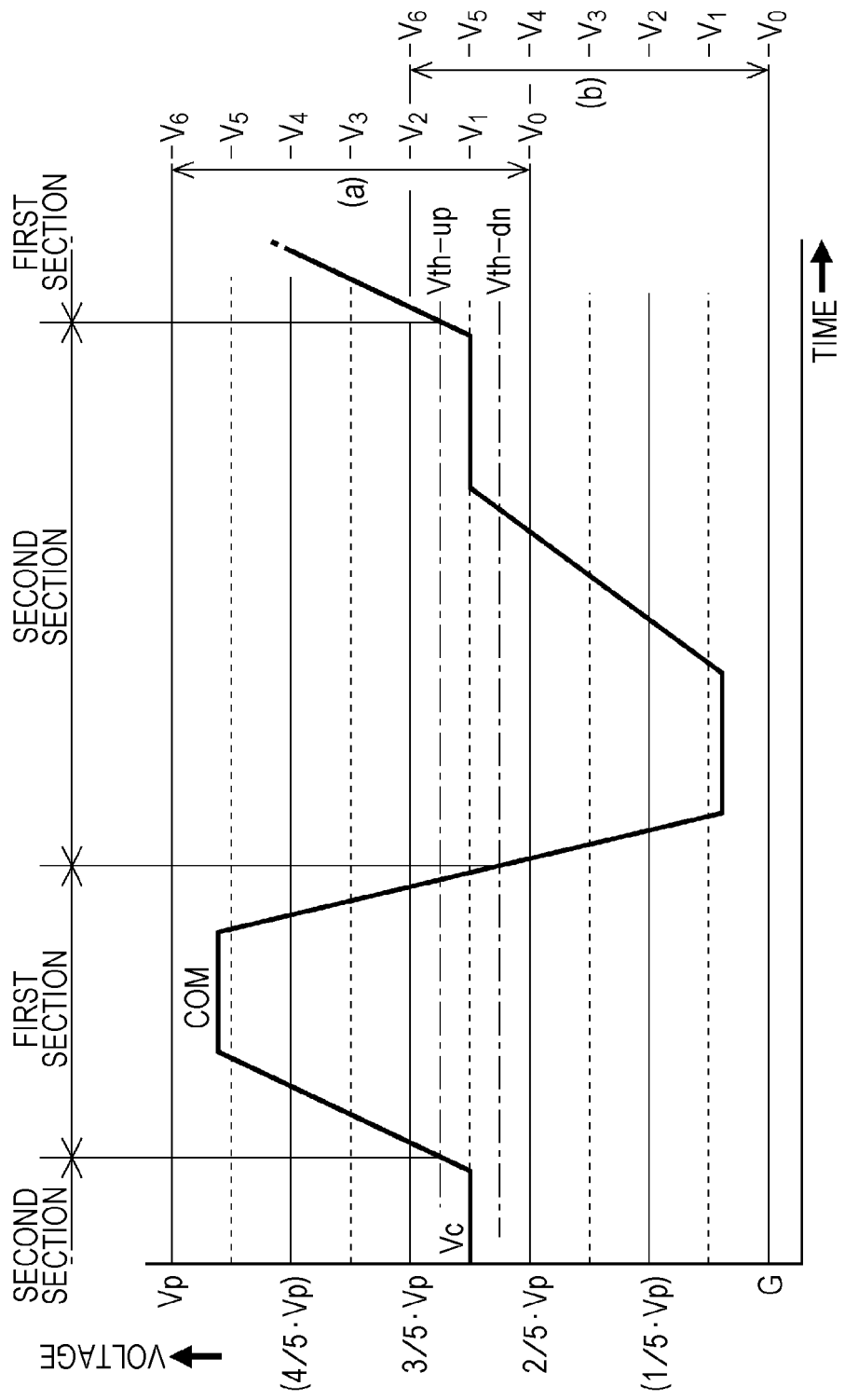
FIG. 5 is a diagram illustrating an operation of an auxiliary power supply circuit with respect to a voltage of a control signal Vin.

FIG. 5 is a diagram illustrating an operation of the auxiliary power supply circuit 50 with respect to the voltage of the control signal COM. FIG. 5 illustrates a state in which the waveform pattern PCOM2 (or PCOM3) which has the greatest amplitude change is extracted among the control signals COM for an illustration.

As illustrated in FIG. 5, a voltage range which the control signal COM can have is equal to or higher than the voltage G (zero) and less than the voltage Vp.

As described above, when the voltage of the control signal COM becomes equal to or greater than the threshold value Vth-up in the course of being increased, the voltage comparator 505 causes the switching device 535 to switch to the voltage (Vp-2Vp/5) as the voltage ($V_6$-$V_0$). When the voltage of the control signal COM becomes less than the threshold value Vth-up in the course of being dropped, the voltage comparator 505 causes the switching device 535 to switch to the voltage (3Vp/5-G) as the voltage ($V_6$-$V_0$). Therefore, the voltage ($V_6$-$V_0$) that is generated by the second CP circuit 52 is switched according to the voltage of the control signal COM as illustrated by (a) or (b) in the right column in FIG. 5.

In other words, in a case where the control signal Vin becomes the waveform pattern of the control signal COM by the ON state of the switch 232, switching is executed by the comparator 505 and the switching device 535 such that the voltage of the control signal Vin is included in a range of the voltage ($V_6$-$V_0$) which is supplied to the driver 30 with respect to the change of the voltage of the control signal COM.

According to the present embodiment, the voltage Vc in the control signal COM is set in a range of being equal to or greater than the threshold value Vth-up and less than the threshold value Vth-up. Therefore, even in a case where the control signal Vin has the voltage Vc by the ON state of the switch 232 or at the time of start or end of the periods T1 to T4, the voltage Vc is included in the range of the voltage ($V_6$-$V_0$) that is supplied to the driver 30 regardless of the switching by the comparator 505 and the switching device 535.

In other words, the voltage Vc is positioned in an overlapping range of the voltage (Vp-2Vp/5) and the voltage (3Vp/5-G).

For the convenience of description, a section from a position where the voltage of the control signal COM becomes equal to or greater than the threshold value Vth-up in the course of being increased to a position where the voltage of the control signal COM becomes less than the threshold value Vth-dn in the course of being dropped is written as a first section. In addition, a section from a position where the voltage of the control signal COM becomes less than the threshold value Vth-dn in the course of being dropped to a position where the voltage of the control signal COM becomes equal to or greater than the threshold value Vth-up after the voltage of the control signal COM changes to be increased is written as a second section.

Figure 6A:
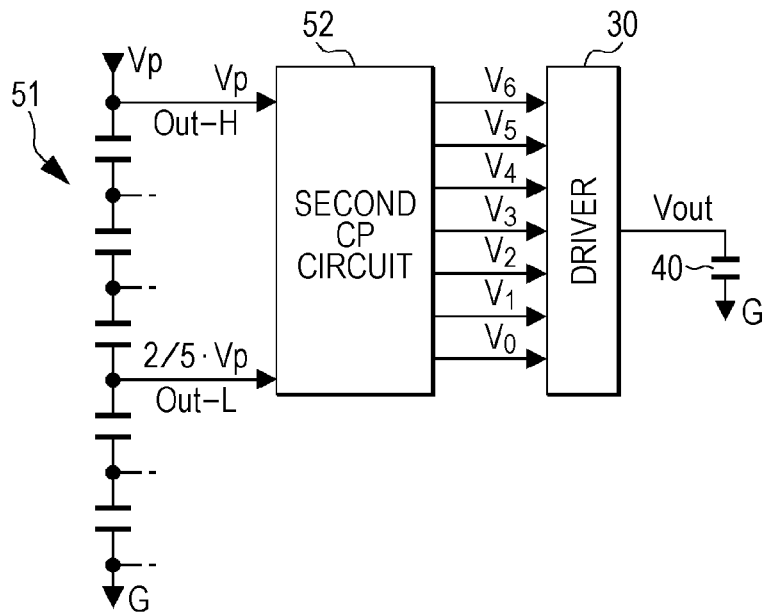
FIGS. 6A and 6B are diagrams illustrating connections in the auxiliary power supply circuit.
Figure 6B:
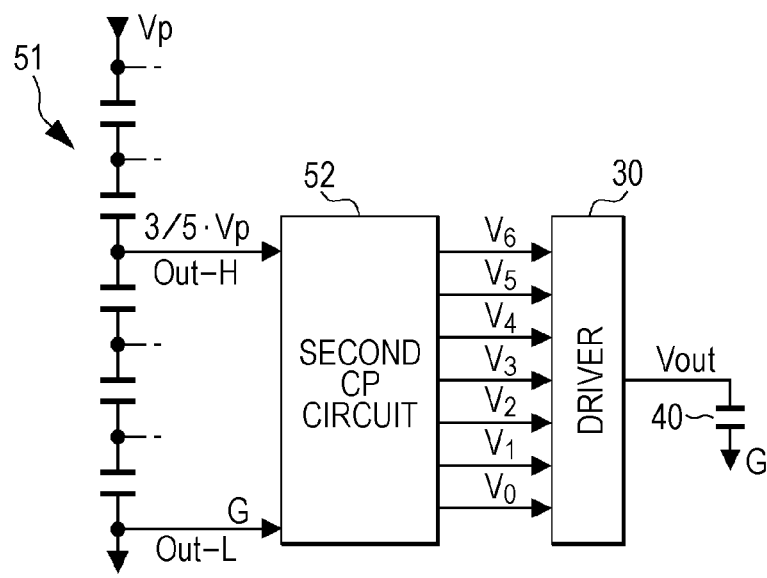

FIGS. 6A and 6B are diagrams illustrating connections between the first CP circuit 51 and the second CP circuit 52 in the auxiliary power supply circuit 50. Since the first CP circuit 51 outputs the voltages Vp, 3Vp/5, 2Vp/5, and G, the first CP circuit 51 is simply shown as five capacitive elements connected in series between the power supply voltages Vp and G in FIGS. 6A and 6B.

In the first section, the output terminal Out-H in the switching device 535 has the voltage Vp and the output terminal Out-L has the voltage 2Vp/5. Therefore, the first CP circuit 51 and the second CP circuit 52 have a connection status as illustrated in FIG. 6A.

In addition, in the second section, the output terminal Out-H in the switching device 535 has the voltage 3Vp/5 and the output terminal Out-L has the voltage G. Therefore, the first CP circuit 51 and the second CP circuit 52 have a connection status as illustrated in FIG. 6B.

The piezoelectric element 40 is provided corresponding to each of the plurality of nozzles in the head unit 20 and is driven by the driver 30 as a counterpart set to the piezoelectric element.

Figure 7:
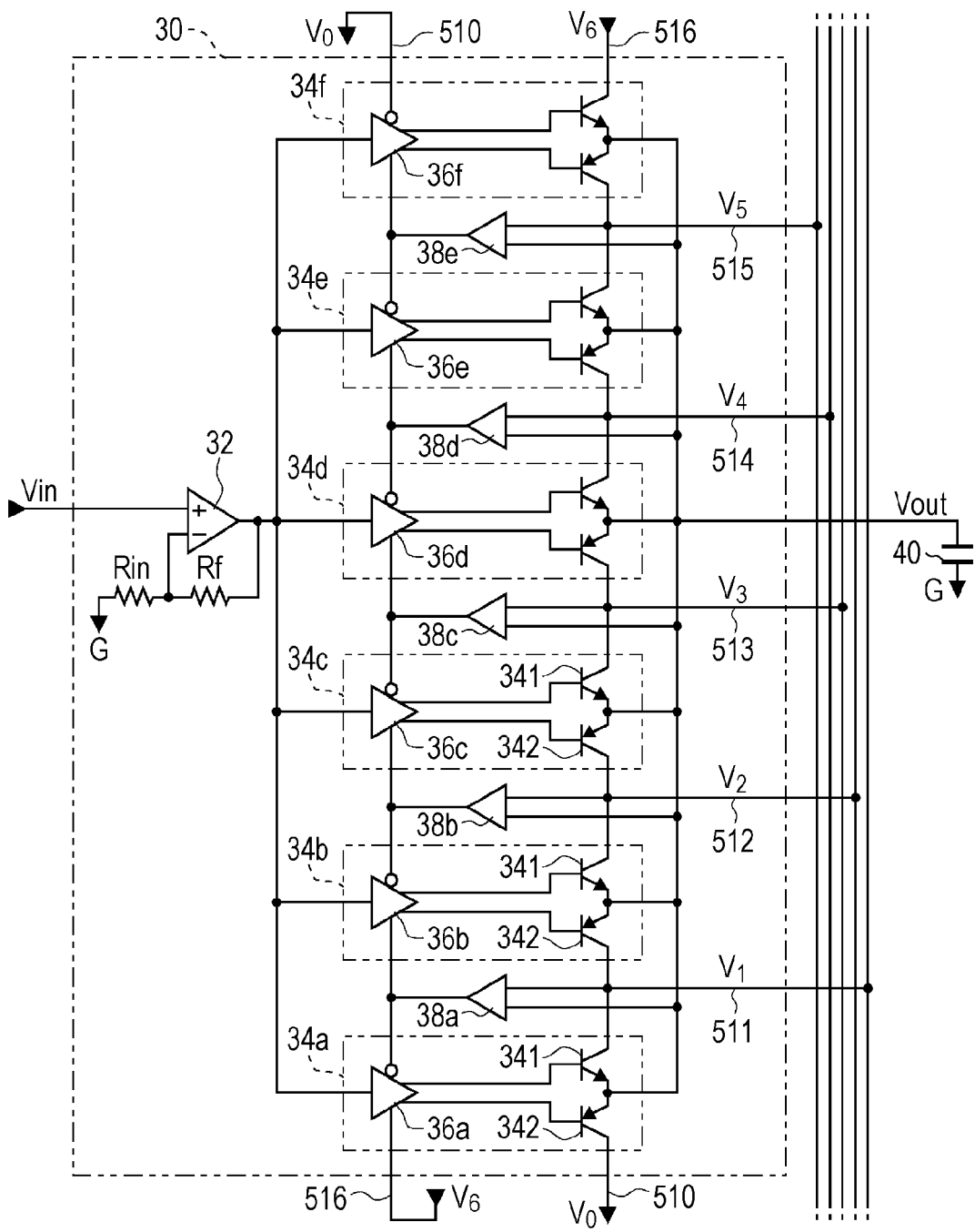
FIG. 7 is a diagram illustrating an example of a configuration of a driver in the head unit.

FIG. 7 is a diagram illustrating an example of a configuration of the driver 30 that drives one piezoelectric element 40.

As illustrated in FIG. 7, the driver 30 includes an operational amplifier 32, unit circuits 34a to 34f, and comparators 38a to 38e, and is configured to drive the piezoelectric element 40 in accordance with the control signal Vin.

The driver 30 uses the voltage $V_6$ to $V_0$ and these seven types of voltages are supplied from the auxiliary power supply circuit 50 (second CP circuit 52) through the wires 510 to 516, respectively.

The control signal Vin selected by the selection section 230 (switch 232) is supplied to an input end (+) of the operational amplifier 32 which is the input end of the driver 30.

An output signal of the operational amplifier 32 is supplied to each of the unit circuits 34a to 34f, returns to the input end (−) of the operational amplifier 32 by negative feedback through resistance Rf, and is grounded to the ground G further through resistance Rin. Therefore, the operational amplifier 32 causes the control signal Vin to be subjected to (1+Rf/Rin) times of non-inverting amplification.

A voltage amplification rate of the operational amplifier 32 can be set by the resistances Rf and Rin, and for the sake of convenience, hereinafter, Rf is set to zero and Rin is set to be infinite. That is, hereinafter, it is described that the voltage amplification rate of the operational amplifier 32 is set to "1", and the control signal Vin is supplied as it is to the unit circuits 34a to 34f. It is needless to say that the voltage amplification rate may be other than "1".

The unit circuits 34a to 34f are provided in ascending order of the voltages corresponding to two adjacent voltages to each other from seven types of voltages $V_6$ to $V_0$. To be more specific, the unit circuit 34a corresponds to the voltage $V_0$ and the voltage $V_1$, the unit circuit 34b corresponds to the voltage $V_1$ and the voltage $V_2$, the unit circuit 34c corresponds to the voltage $V_2$ and the voltage $V_3$, the unit circuit 34d corresponds to the voltage $V_3$ and the voltage $V_4$, the unit circuit 34e corresponds to the voltage $V_4$ and the voltage $V_5$, and the unit circuit 34f corresponds to the voltage $V_5$ and the voltage $V_6$.

Circuit configurations of the unit circuits 34a to 34f are the same as each other, and each includes one corresponding level shifter of the level shifters 36a to 36f, a bipolar NPN type transistor 341, and a PNP type transistor 342.

When the unit circuits 34a to 34f are described not specifically but generally, the unit circuit is described only with a reference number "34". Similarly, level shifters 36a to 36f are described not specifically but generally, the level shifter is described only with a reference number "36".

The level shifter 36 has either an enable status or a disable status. To be more specific, when an L-level signal is supplied to a negative control end to which a circle is attached and an H-level signal is supplied to a positive control end to which no circle is attached, the level shifter 36 enters the enable status. Otherwise, the level shifter 36 is in a disable status.

As will be described later, the comparators 38a to 38e are each associated with the intermediate five types of voltages $V_1$ to $V_5$ of the above seven types of voltages, one to one.

Here, when a certain unit circuit 34 is focused on, an output signal of the comparator associated with a higher-side voltage of the two voltages corresponding to the unit circuit 34 is supplied to the negative control end of the level shifter 36 in the unit circuit 34. An output signal of the comparator associated with a lower-side voltage of the two voltages corresponding to the unit circuit is supplied to the positive control end of the level shifter 36.

However, while the negative control end of the level shifter 36f in the unit circuit 34f is connected to the wire 510 which supplies the voltage $V_0$, the positive control end of the level shifter 36a in the unit circuit 34a is connected to the wire 516 which supplies the voltage $V_6$.

In addition, in the enable status, the level shifter 36 shifts the voltage of the input control signal Vin by a predetermined value in a minus direction and supplies the result to a base terminal of the transistor 341, and simultaneously, the level shifter 36 shifts the voltage of the control signal Vin by a predetermined value in a plus direction and supplies the result to a base terminal of the transistor 342. In the disable status, regardless of the control signal Vin, the level shifter 36 supplies a voltage that causes the transistor 341 to be in the OFF state, for example, the voltage $V_6$, to the base terminal of the transistor 341, and simultaneously, supplies a voltage that causes the transistor 342 to be in the ON state, for example, the voltage $V_0$, to the base terminal of the transistor 342.

The predetermined value is set to a voltage (bias voltage, substantially 0.6 volts) between the base-emitter which is measured when a current starts to flow to the emitter terminal. That is, the predetermined value is a property determined according to the characteristics of the transistors 341 and 342 and becomes zero if the transistors 341 and 342 are in an ideal state.

A higher-side voltage of the corresponding two voltages is supplied to a collector terminal of the transistor 341, and a lower-side voltage is supplied to a collector terminal of the transistor 342.

For example, in the unit circuit 34a corresponding to the voltage $V_0$ and voltage $V_1$, the collector terminal of the transistor 341 is connected to the wire 511 which supplies the voltage $V_1$ and the collector terminal of the transistor 342 is connected to the wire 510 which supplies the voltage $V_0$. In addition, in the unit circuit 34b corresponding to the voltage $V_1$ and voltage $V_2$, the collector terminal of the transistor 341 is connected to the wire 512 which supplies the voltage $V_2$ and the collector terminal of the transistor 342 is connected to the wire 511 which supplies the voltage $V_1$. In the unit circuit 34f corresponding to the voltage $V_5$ and voltage $V_6$, the collector terminal of the transistor 341 is connected to the wire 516 which supplies the voltage $V_6$ and the collector terminal of the transistor 342 is connected to the wire 515 which supplies the voltage $V_5$.

Meanwhile, emitter terminals of the transistors 341 and 342 in the unit circuits 34a to 34f are connected commonly to an end of the piezoelectric element 40 and a common connection point of the emitter terminals of the transistors 341 and 342 is connected to an end of the piezoelectric element 40 as an output end of the driver 30.

A voltage of one end of the piezoelectric element 40 is described as Vout.

The comparators 38a to 38e corresponding to five types of voltages $V_1$ to $V_5$, respectively, compare the high and low of the voltages supplied to two input ends and output a signal indicating the compared result. Here, the corresponding voltage is supplied to one end of the two input ends in the comparators 38a to 38e and the other end is connected commonly to the emitter terminals of the transistors 341 and 342 and one end of the piezoelectric element 40. For example, in the comparator 38a corresponding to the voltage $V_1$, the corresponding voltage $V_1$ is supplied to one end of the two input ends and in the comparator 38b corresponding to the voltage $V_2$, the corresponding voltage $V_2$ is supplied to one end of the two input ends.

Each of the comparators 38a to 38e outputs an H-level signal when the voltage Vout at one end of the input end is equal to or higher than the voltage of the other end, and outputs an L-level signal when the voltage Vout is less than the voltage of the other end.

Specifically, the comparator 38a outputs an H-level signal when the voltage Vout is equal to or higher than the voltage $V_1$, and outputs an L-level signal when the voltage Vout is less than the voltage $V_1$. In addition, the comparator 38b outputs an H-level signal when the voltage Vout is equal to or higher than the voltage $V_2$, and outputs an L-level signal when the voltage Vout is less than the voltage $V_2$.

When one voltage is focused on out of the five types of voltages, the configuration is the same as above in that the output signal from the comparator corresponding to the focused-on voltage is supplied to both of a negative input end of the level shifter 36 of the unit circuit in which the voltage becomes the higher-side voltage and a positive input end of the level shifter 36 of the unit circuit in which the voltage becomes the lower-side voltage.

For example, the output signal from the comparator 38a corresponding to the voltage $V_1$ is supplied to both of a negative input end of the level shifter 36a of the unit circuit 34a with which the voltage $V_1$ is associated as the higher-side voltage and a positive input end of the level shifter 36b of the unit circuit 34b with which the voltage $V_1$ is associated as the lower-side voltage. In addition, the output signal from the comparator 38b corresponding to the voltage $V_2$ is supplied to both of a negative input end of the level shifter 36b of the unit circuit 34b with which the voltage $V_2$ is associated as the higher-side voltage and a positive input end of the level shifter 36c of the unit circuit 34c with which the voltage $V_2$ is associated as the lower-side voltage.

When the voltages $V_1$, $V_2$, . . . represent a first voltage, a second voltage, . . . , respectively, the wires 511 and 512 . . . correspond to a first signal path, a second signal path, . . . , respectively.

Next, the operation of the driver 30 will be described.

The voltage ($V_6$-$V_0$) which is supplied to the driver 30 is switched to the higher-side voltage set or to the lower-side voltage set according to the control signal COM. Here, a case of the higher-side voltage set is first described and then an operation in a case where switching to the lower-side voltage set occurs will be described later.

First, a description of checking the statuses of the level shifters 36a to 36f with respect to the voltage Vout at one end of the piezoelectric element 40 is provided. In a case where the higher-side voltage set (Vp and 2Vp/5) is selected, the voltages $V_6$ to $V_0$ have a relationship illustrated by (a) in the right column in FIG. 5.

Figure 8:
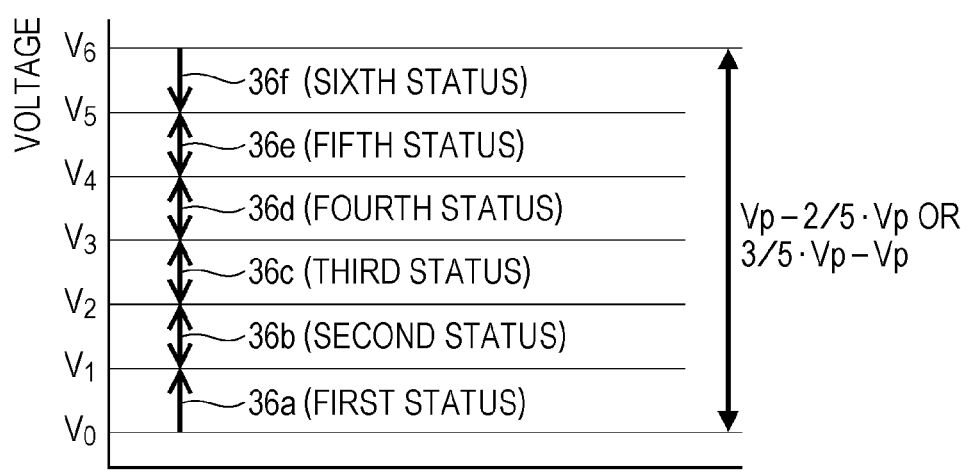
FIG. 8 is a diagram illustrating an operational range of each level shifter in the driver.

FIG. 8 is a diagram illustrating a range of a voltage in which the level shifters 36a to 36f are in the enable status with respect to the voltage Vout.

First, in a first status in which the voltage Vout is less than the voltage $V_1$, the output signals from the comparators 38a to 38e all have the L level. Therefore, in the first status, only the level shifter 36a is in the enable status and the other level shifters 36b to 36f are in the disable status.

In a second status in which the voltage Vout is equal to or higher than the voltage $V_1$ and less than the voltage $V_2$, only the output signal from the comparator 38b becomes the H level and the output signals from the other comparators become the L level. Accordingly, in the second status, only the level shifter 36b is in the enable status and the other level shifters 36a and 36c to 36f are in the disable status.

Next, in a third status in which the voltage Vout is equal to or higher than the voltage $V_2$ and less than the voltage $V_3$, only the level shifter 36c is in the enable status. In a fourth status in which the voltage Vout is equal to or higher than the voltage $V_3$ and less than the voltage $V_4$, only the level shifter 36d is in the enable status. In a fifth status in which the voltage Vout is equal to or higher than the voltage $V_4$ and less than the voltage $V_5$, only the level shifter 36e is in the enable status. In a sixth status in which the voltage Vout is equal to or higher than the voltage $V_5$, only the level shifter 36f is in the enable status.

When the level shifter 36a is in the enable status in the first status, the level shifter 36a supplies a voltage signal on which the level shifting of the control signal Vin by a predetermined value is performed in the minus direction to the base terminal of the transistor 341 in the unit circuit 34a, and supplies a voltage signal on which the level shifting of the control signal Vin by the predetermined value is performed in the plus direction to the base terminal of the transistor 342 in the unit circuit 34a.

Here, when the voltage of the control signal Vin is higher than the voltage Vout (voltage of the connection point of the emitter terminals to each other), a current in accordance with the difference (voltage between the base-emitter, to be more exact, voltage obtained by subtracting a predetermined value from the voltage between the base-emitter) flows from the collector terminal of the transistor 341 to the emitter terminal thereof. Therefore, when the voltage Vout is gradually increased and approaches the voltage of the control signal Vin and eventually the voltage Vout reaches the voltage of the control signal Vin, the current flowing to the transistor 341 becomes zero at this time.

Meanwhile, when the voltage of the control signal Vin is lower than the voltage Vout, a current in accordance with the difference flows from the emitter terminal of the transistor 342 to the collector terminal thereof. Therefore, when the voltage Vout is gradually lowered and approaches the voltage of the control signal Vin and eventually the voltage Vout reaches the voltage of the control signal Vin, the current flowing to the transistor 342 becomes zero at this time.

Accordingly, in the first status, the transistors 341 and 342 of the unit circuit 34a execute control of the voltage Vout to reach the control signal Vin.

Since, in the first status, the level shifter 36 is in the disable status in the unit circuits 34b to 34f except for the unit circuit 34a, the voltage $V_6$ is supplied to the base terminal of the transistor 341 and the voltage $V_0$ is supplied to the base terminal of the transistor 342. Therefore, since, in the first status, the transistors 341 and 342 are in the OFF state in the unit circuits 34b to 34f, the transistors 341 and 342 are not involved in the control of the voltage Vout.

Here, the operation in the first status is described, and the operations in the second to sixth statuses are the same. To be more specific, any one of the unit circuits 34a to 34f is activated according to the voltage Vout held in the piezoelectric element 40, and the activated transistors 341 and 342 of the unit circuit 34 control the voltage Vout to reach the control signal Vin. Therefore, regarding all of the drivers 30, the voltage Vout is caused to follow the voltage of the control signal Vin.

Figure 9A:
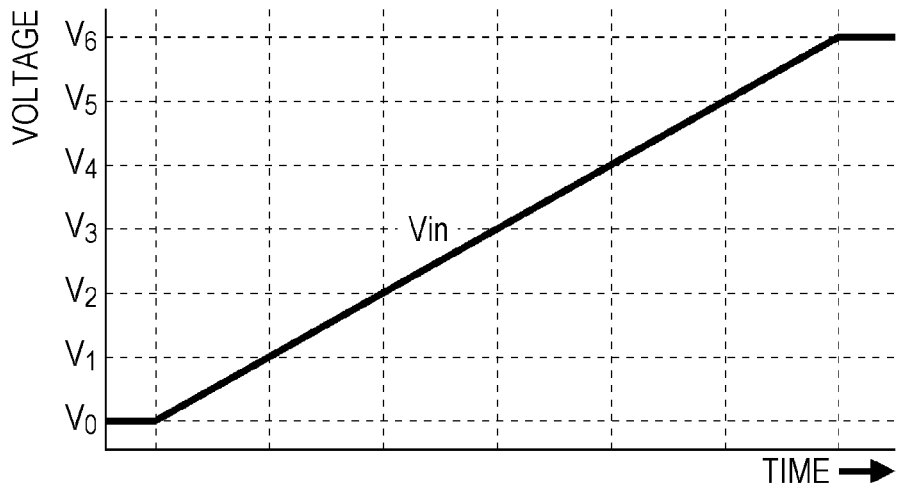
FIGS. 9A and 9B are diagrams illustrating examples of relationships between inputs and outputs in the driver.
Figure 9B:
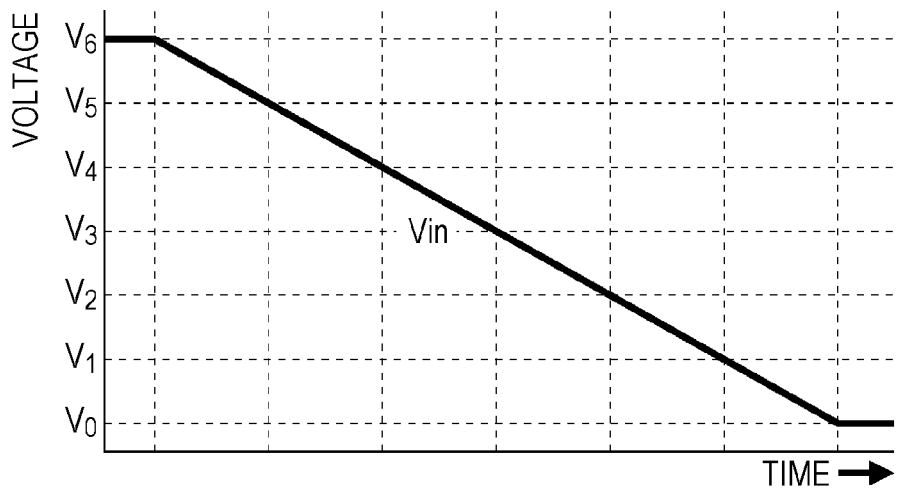

Accordingly, as illustrated in FIG. 9A, when the control signal Vin is increased, for example, from the voltage $V_0$ to voltage $V_6$, the voltage Vout follows the control signal Vin and also changes from the voltage $V_0$ to voltage $V_6$. In addition, as illustrated in FIG. 9B, when the control signal Vin is lowered from the voltage $V_6$, the voltage Vout follows the control signal Vin and also changes from the voltage $V_6$.

According to the present embodiment, when the control signal COM becomes equal to or greater than the threshold value Vth-up, the voltages $V_6$ to $V_0$ are switched to the higher-side voltage set, and when the control signal COM is less than the threshold value Vth-dn, the voltages $V_6$ to $V_0$ are switched to the lower-side voltage set.

FIGS. 10A to 10C are diagrams illustrating the operation of the level shifter.

When the control signal Vin changes to be increased from the voltage $V_0$ to voltage $V_6$, the voltage Vout is increased to follow the control signal Vin. In this increasing process, in the first status in which the voltage Vout is less than the voltage $V_1$, the level shifter 36a enters the enable status. Therefore, as illustrated in FIG. 10A, the voltage (written as "P type") which is supplied to the base terminal of the transistor 341 by the level shifter 36a becomes the voltage on which the shifting of the control signal Vin by the predetermined value is performed in the minus direction, and the voltage (written as "N type") which is supplied to the base terminal of the transistor 342 becomes the voltage on which the shifting of the control signal Vin by the predetermined value is performed in the plus direction. Meanwhile, in the statuses other than the first status, since the level shifter 36a is in the disable status, the voltage that is supplied to the base terminal of the transistor 341 becomes $V_6$ and the voltage that is supplied to the base terminal of the transistor 342 becomes $V_0$.

FIG. 10B illustrates a voltage waveform output from the level shifter 36b and FIG. 10C illustrates a voltage waveform output from the level shifter 36f. As long as heed is paid to the process in which the level shifter 36b enters the enable status in the second status in which the voltage Vout is equal to or higher than the voltage $V_1$ and less than the voltage $V_2$, and the level shifter 36f enters the enable status in the sixth status in which the voltage Vout is equal to or higher than the voltage $V_5$ and less than the voltage $V_6$, a specific description is not necessary.

In addition, a description of the operations of the level shifters 36a to 36f in the process of increasing the voltage (or voltage Vout) of the control signal Vin or a description of the operations of the level shifters 36a to 36f in the process of lowering the voltage (or voltage Vout) of the control signal Vin is omitted.

Next, flow of the current (charge) in the unit circuits 34a to 34f will be described by taking examples of the unit circuits 34a and 34b both during charging and during discharging.

FIG. 11 is a diagram illustrating the operation of the piezoelectric element 40 which is charged in the first status (status in which the voltage Vout is less than voltage $V_1$).

Since, in the first status, the level shifter 36a is in the enable status and the other level shifters 36b to 36f are in the disable status, only the unit circuit 34a may be focused on.

When the voltage of the control signal Vin is higher than the voltage Vout in the first status, the transistor 341 of the unit circuit 34a causes the current to flow in accordance with the voltage between the base-emitter. Meanwhile, the transistor 342 of the unit circuit 34a is in the OFF state.

During the charging in the first status, the current flows through a path from the wire 511 through the transistor 341 (of the unit circuit 34a) to the piezoelectric element 40 as illustrated by an arrow in FIG. 11 such that the piezoelectric element 40 is charged with the charge. The voltage Vout is increased by the charging. Eventually, when the voltage Vout approaches and reaches the voltage of the control signal Vin, the transistor 341 of the unit circuit 34a enters the OFF state and thus the charging of the piezoelectric element 40 is stopped.

Meanwhile, in a case where the control signal Vin is increased to be equal to or higher than the voltage $V_1$, the voltage Vout follows the control signal Vin and becomes equal to or higher than the voltage $V_1$. Therefore, the status is changed from the first status to the second status (status in which the voltage Vout is equal to or higher than the voltage $V_1$ and less than the voltage $V_2$).

FIG. 12 is a diagram illustrating the operation of the piezoelectric element 40 which is charged in the second status.

In the second status, since the level shifter 36b is in the enable status and the other level shifters 36a and 36c to 36f are in the disable status, only the unit circuit 34b may be focused on.

When the voltage of the control signal Vin is higher than the voltage Vout in the second status, the transistor 341 of the unit circuit 34b causes the current to flow in accordance with the voltage between the base-emitter. Meanwhile, the transistor 342 of the unit circuit 34b is in the OFF state.

During the charging in the second status, the current flows through a path from the wire 512 through the transistor 341 (of the unit circuit 34b) to the piezoelectric element 40 as illustrated by an arrow in FIG. 12 such that the piezoelectric element 40 is charged with the charge. That is, in a case where the piezoelectric element 40 is charged in the second status, one end of the piezoelectric element 40 is connected electrically to the auxiliary power supply circuit 50 through the wire 512.

When the status is changed from the first status to the second status during the increase of the voltage Vout, a current supplying source switches from the wire 511 to the wire 512.

Eventually, when the voltage Vout approaches and reaches the voltage of the control signal Vin, the transistor 341 of the unit circuit 34b enters the OFF state and thus the charging of the piezoelectric element 40 is stopped.

Meanwhile, in a case where the control signal Vin is increased to be equal to or higher than the voltage $V_2$, the voltage Vout follows the control signal Vin and becomes equal to or higher than the voltage $V_2$. As a result, the status is changed from the second status to the third status (status in which the voltage Vout is equal to or higher than the voltage $V_2$ and less than the voltage $V_3$).

Since the charging operations from the third status to the sixth status are substantially the same, the current (charge) supplying sources switch to wires 513, 514, 515, and 516 sequentially (not particularly illustrated).

FIG. 13 is a diagram illustrating the operation of the piezoelectric element 40 which is discharged in the second status.

In the second status, the level shifter 36b is in the enable status. When the voltage of the control signal Vin is lower than the voltage Vout in this status, the transistor 342 of the unit circuit 34b causes the current to flow in accordance with the voltage between the base-emitter. Meanwhile, the transistor 341 of the unit circuit 34b is in the OFF state.

During the discharging in the second status, the current flows through a path from the piezoelectric element 40 through the transistor 342 (of the unit circuit 34b) to the wire 511 as illustrated by an arrow in FIG. 13 such that the charge is discharged from the piezoelectric element 40. That is, in a case where the charge is charged in the piezoelectric element 40 in the first status, and in a case where the charge is discharged from the piezoelectric element 40 in the second status, one end of the piezoelectric element 40 is connected electrically to the auxiliary power supply circuit 50 through the wire 511. In addition, the wire 511 supplies the current (charge) during the charging in the first status and collects the current (charge) during the discharging in the second status. The collected charge is redistributed and reused by the auxiliary power supply circuit 50.

Eventually, when the voltage Vout approaches and reaches the voltage of the control signal Vin, the transistor 342 of the unit circuit 34b enters the OFF state and thus the discharging of the piezoelectric element 40 is stopped.

Meanwhile, in a case where the control signal Vin is lowered to be less than the voltage $V_1$, the voltage Vout follows the control signal Vin and becomes less than the voltage $V_1$. As a result, the status is changed from the second status to the first status.

FIG. 14 is a diagram illustrating the operation of the piezoelectric element 40 which is discharged in the first status.

In the first status, the level shifter 36a is in the enable status. When the voltage of the control signal Vin is lower than the voltage Vout in this status, the transistor 342 of the unit circuit 34a causes the current to flow in accordance with the voltage between the base-emitter.

At this time the transistor 341 of the unit circuit 34a is in the OFF state.

During the discharging in the first status, the current flows through a path from the piezoelectric element 40 through the transistor 342 (of the unit circuit 34a) to the wire 510 as illustrated by an arrow in FIG. 14 such that the charge is discharged from the piezoelectric element 40.

Here, the unit circuits 34a and 34b are described as examples both during the charging and during the discharging. The unit circuits 34c to 34f operate in substantially the same way except that the transistors 341 and 342 which control the current are different.

In addition, in the discharge path and the charge path in each status, the path from one end of the piezoelectric element 40 to the connection point of the emitter terminals to each other in the transistors 341 and 342 is shared.

According to the present embodiment, when the control signal COM is less than the threshold value Vth-dn, the voltages $V_6$ to $V_0$ are switched to the lower-side voltage set illustrated by (b) on the right column in FIG. 5. Therefore, the voltage $V_6$ becomes the voltage 3Vp/5, the voltage $V_0$ becomes the voltage G, and the voltages $V_5$ to $V_1$ become the intermediate voltages which divide the voltage 3Vp/5 to voltage G into six.

In the voltages $V_6$ to $V_0$ corresponding to the higher-side voltage set illustrated by (a) in the right column in FIG. 5, the threshold value Vth-dn is included in a range from the voltage $V_1$ to voltage $V_0$. Therefore, the level shifter 36a enters the enable status in the driver 30 immediately before the voltage of the control signal COM becomes less than the threshold value Vth-dn. Meanwhile, in the voltages $V_6$ to $V_0$ corresponding to the lower-side voltage set illustrated by (b) in the right column in FIG. 5, the threshold value Vth-dn is included in a range from the voltage $V_5$ to voltage $V_4$. Therefore, the level shifter 36e enters the enable status in the driver 30 immediately after the voltage of the control signal COM becomes less than the threshold value Vth-dn.

Accordingly, when the voltages are switched from the higher-side voltage set to the lower-side voltage set, the switching to the enable status is performed from the level shifter 36a to level shifter 36e in the driver 30. Therefore, the circuit to control the voltage Vout is changed from the unit circuit 34a to the unit circuit 34e. The subsequent operations are the same as the case where the voltages $V_6$ to $V_0$ become the higher-side voltage set.

In addition, when the control signal COM is equal to or higher than the threshold value Vth-up, the voltages $V_6$ to $V_0$ are switched from the lower-side voltage set illustrated by (b) to the higher-side voltage set illustrated by (a). Therefore, the voltage $V_6$ becomes the voltage Vp, the voltage $V_0$ becomes the voltage 2Vp/5, and the voltages $V_5$ to $V_1$ become the intermediate voltages which divide the voltage Vp to voltage 2Vp/5 into six.

In the voltages $V_6$ to $V_0$ corresponding to the lower-side voltage set illustrated by (b), the threshold value Vth-up is included in a range from the voltage $V_5$ to voltage $V_6$. Therefore, the level shifter 36f enters the enable status in the driver 30 immediately before the voltage of the control signal COM becomes equal to or higher than the threshold value Vth-up. Meanwhile, in the voltages $V_6$ to $V_0$ corresponding to the higher-side voltage set illustrated by (a), the threshold value Vth-up is included in a range from the voltage $V_1$ to voltage $V_2$. Therefore, the level shifter 36b enters the enable status in the driver 30 immediately after the voltage of the control signal COM becomes equal to or higher than the threshold value Vth-up.

Accordingly, when the voltages are switched from the lower-side voltage set to the higher-side voltage set, the switching to the enable status is performed from the level shifter 36f to level shifter 36b in the driver 30. Therefore, the circuit to control the voltage Vout is changed from the unit circuit 34f to the unit circuit 34b. The subsequent operations are as described above.

When the switch 232 is in the OFF state and the control signal Vin is the voltage Vc, the voltage Vc is included in the range of the voltages $V_6$ to $V_0$ regardless of the voltages $V_6$ to $V_0$ being the lower-side voltage set or the higher-side voltage set. Therefore, in the driver 30, control of the voltage Vout to become the voltage Vc of the control signal Vin is executed.

According to the present embodiment, when the voltages $V_6$ to $V_0$ are switched to either the lower-side voltage set or the higher-side voltage set according to the voltage of the control signal COM and supplied to the driver 30, the driver 30 controls the voltage Vout to become the voltage of the control signal Vin that extracts the control signal COM (or replaced with the voltage Vc)

Next, the first CP circuit 51 and the second CP circuit 52 in the auxiliary power supply circuit 50 will be described.

Figure 15:
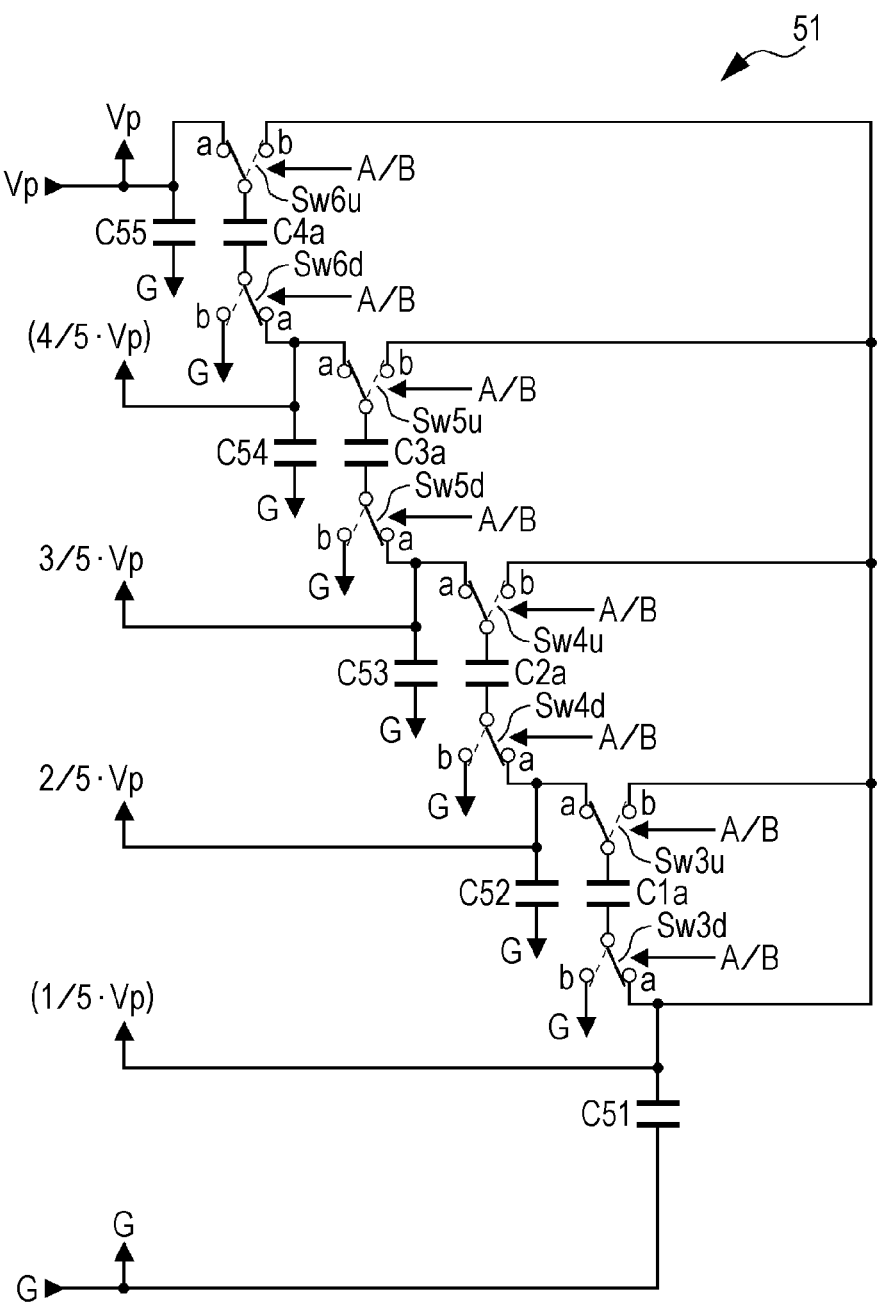
FIG. 15 is a diagram illustrating an example of a configuration of a first CP circuit in the auxiliary power supply circuit.

FIG. 15 is a diagram illustrating an example of a configuration of the first CP circuit 51.

As illustrated in FIG. 15, the first CP circuit 51 is configured to have switches Sw3d, Sw3u, Sw4d, Sw4u, Sw5d, Sw5u, Sw6d, and Sw6u, and capacitive elements C51, C52, C53, C54, C55, C1a, C2a, C3a, and C4a.

Among these components, the switches are all one-pole two-throw (single pole double throw) switches and a common terminal is connected to any one of terminals a and b in accordance with a control signal A/B. In a brief description, the control signal A/B is a pulse signal in which a duty ratio is substantially 50%, for example, and the frequency thereof is set to be about 20 times the frequency of the control signals COM. Such a control signal A/B may be generated by an internal oscillator (not illustrated) in the auxiliary power supply circuit 50 or may be supplied from the control unit 10 through the flexible cable 190. The capacitive elements C51, C1a, C2a, C3a, and C4a are used for charge transfer. The capacitive elements C51, C52, C53, C54, and C55 are used for backup. Therefore, the capacitive element C51 serves as the element for both the charge transfer and the backup.

Practically, the above switches are configured by combining the transistors in a semiconductor integrated circuit, and the capacitive elements are mounted on the semiconductor integrated circuit externally. It is desired that the semiconductor integrated circuit have a configuration in which the plurality of drivers 30 described above is also formed.

In the first CP circuit 51, the voltage Vp is supplied to one end of the capacitive element C55 and to a terminal a of the switch Sw6u. A common terminal of the switch Sw6u is connected to one end of the capacitive element C4a and the other end of the capacitive element C4a is connected to a common terminal of the switch Sw6d. A terminal a of the switch Sw6d is connected to one end of the capacitive element C54 and to a terminal a of the switch Sw5u. A common terminal of the switch Sw5u is connected to one end of the capacitive element C3a and the other end of the capacitive element C3a is connected to a common terminal of the switch Sw5d. A terminal a of the switch Sw5d is connected to one end of the capacitive element C53 and to a terminal a of the switch Sw4u. A common terminal of the switch Sw4u is connected to one end of the capacitive element C2a and the other end of the capacitive element C2a is connected to a common terminal of the switch Sw4d. A terminal a of the switch Sw4d is connected to one end of the capacitive element C52 and to a terminal a of the switch Sw3u. A common terminal of the switch Sw3u is connected to one end of the capacitive element C1a and the other end of the capacitive element C1a is connected to a common terminal of the switch Sw3d. A terminal a of the switch Sw3d is connected to one end of the capacitive element C51 and to each terminal b of the switches Sw6u, Sw5u, Sw4u, and Sw3u. The other ends of the capacitive elements C55, C54, C53, C52, and C51 and the terminals b of the switches Sw6d, Sw5d, Sw4d, and Sw3d, are commonly grounded to the voltage G.

For example, when the switches Sw6u and Sw6d and the capacitive elements connection pieces 55 and C4a are considered as one stage, the first CP circuit 51 can have a configuration of a four-stage plus capacitive element C51.

Figure 16A:
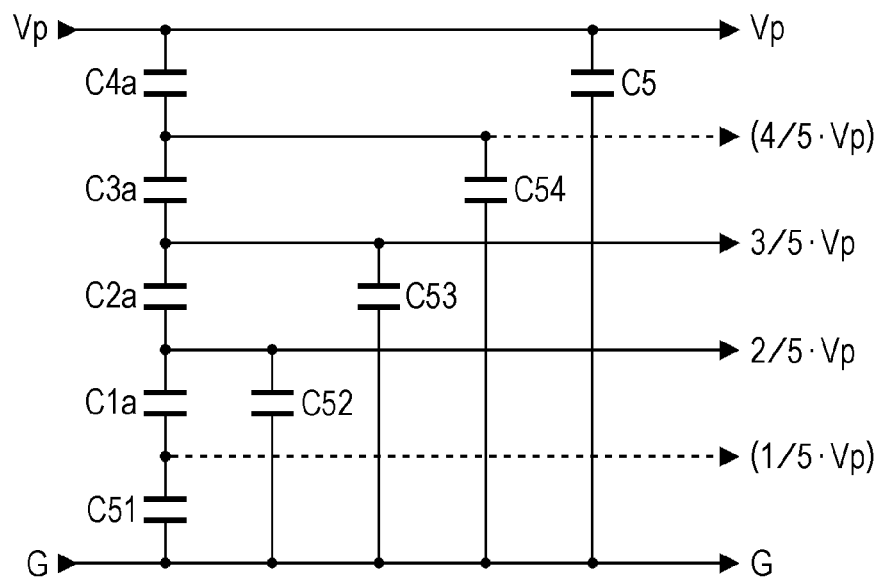
FIGS. 16A and 16B are diagrams illustrating operations of the first CP circuit.
Figure 16B:
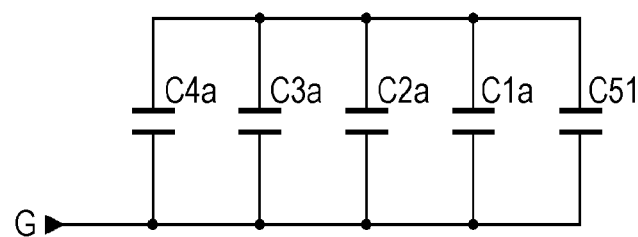

FIGS. 16A and 16B are diagrams illustrating the connection status of the switches in the first CP circuit 51.

Each switch has two statuses of a status (status A) in which the common terminal is connected to the terminal a by the control signal A/B and a status (status B) in which the common terminal is connected to the terminal b. FIG. 16A illustrates the connection of the status A in the first CP circuit 51 and FIG. 16B illustrates the connection of the status B by using equivalent circuits in a simplified manner, respectively.

In the status A, the capacitive elements C4a, C3a, C2a, C1a, and C51 are connected in series between the voltages Vp and G. Therefore, the status A may be called a series status. Meanwhile, in the status B, one-side ends of the capacitive elements C4a, C3a, C2a, C1a, and C51 are commonly connected to one another. Therefore, the status B may be called a parallel status. In the status B, since the capacitive elements C4a, C3a, C2a, C1a, and C51 are connected in parallel to one another, the hold voltage is equalized.

The switches Sw3d, Sw3u, Sw4d, Sw4u, Sw5d, Sw5u, Sw6d, and Sw6u in FIG. 15 function as a first switching section that switches between the series connection and the parallel connection of the capacitive elements C4a, C3a, C2a, C1a, and C51 in the first CP circuit 51.

In addition, when the voltages $V_1, V_2, \ldots$, represent a first voltage, a second voltage, . . . , respectively, the wires 511, 512, . . . , correspond to a first signal path, a second signal path, . . . , respectively. Therefore, in the status A of FIG. 17 or FIG. 18A, one end of the capacitive element C61 that holds the voltage $V_1$ becomes a first connection point and one end of the capacitive element C62 that holds the voltage $V_2$ becomes a second connection point.

When the statuses A and B are repeated alternately, the voltage Vp/5 equalized in the status B is increased one to five times as high by the series connection of the status A and the voltages are held in the capacitive elements C51 to C55. Among these hold voltages, one end of the capacitive element C53 as the voltage 3Vp/5, one end of the capacitive element C52 as voltage 2Vp/5, and the voltages Vp and G are supplied to the switching device 53S.

According to the present embodiment, the voltage 4Vp/5 that is one end of capacitive element C54 and the voltage Vp/5 that is one end of the capacitive element C51 are not used in the configuration.

Figure 17:
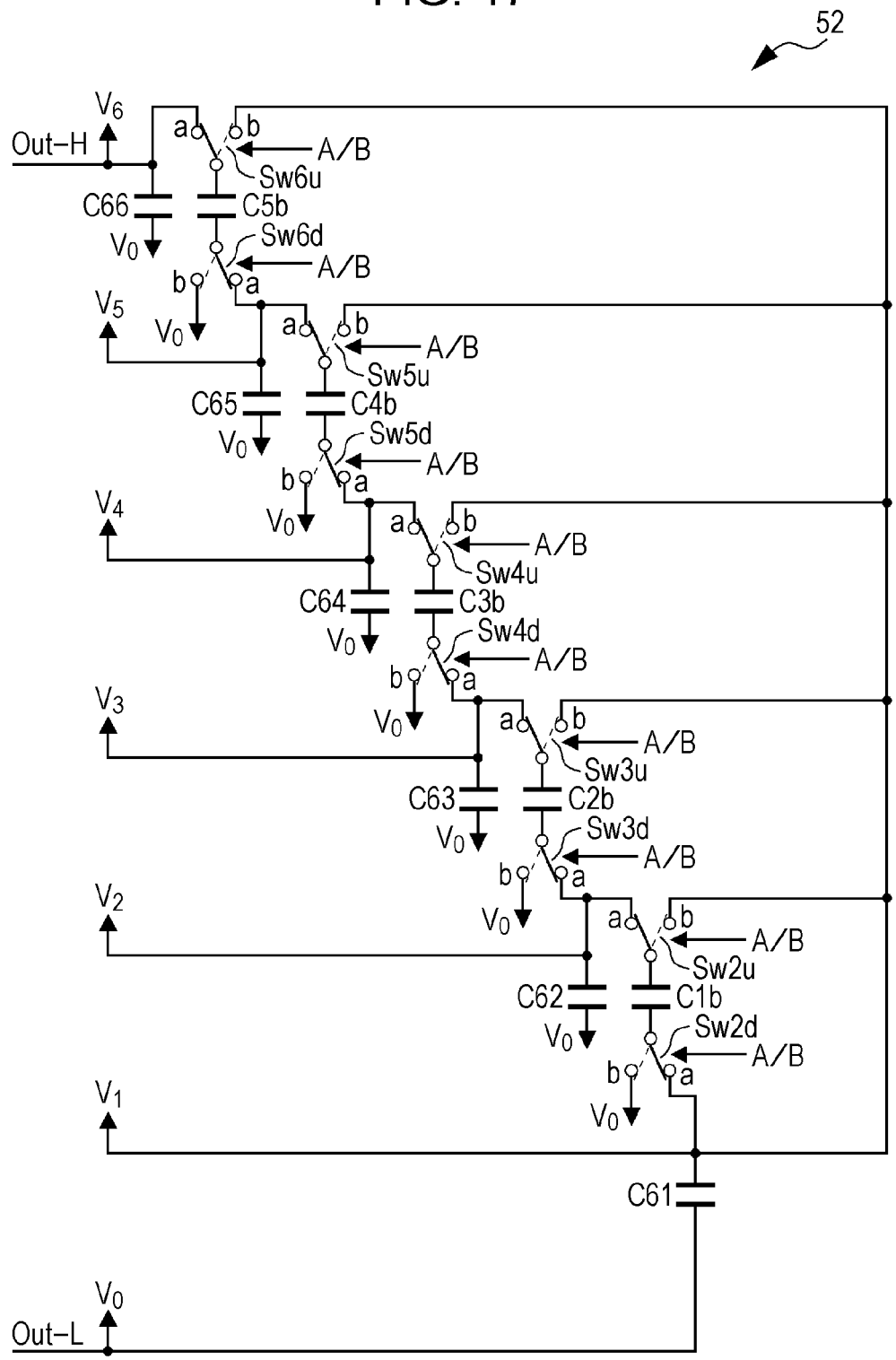
FIG. 17 is a diagram illustrating an example of a configuration of a second CP circuit in the auxiliary power supply circuit.

FIG. 17 is a diagram illustrating an example of a configuration of the second CP circuit 52.

As illustrated in FIG. 15, the second CP circuit 52 is configured to have switches Sw2d, Sw2u, Sw3d, Sw3u, Sw4d, Sw4u, Sw5d, Sw5u, Sw6d, and Sw6u, and capacitive elements C61, C62, C63, C64, C65, C66, C1b, C2b, C3b, C4b, and C5b.

That is, the second CP circuit 52 has a configuration (five-stage plus capacitive element C61) in which the number of stages is increased by one stage in terms of a circuit compared to the first CP circuit 51.

Figure 18A:
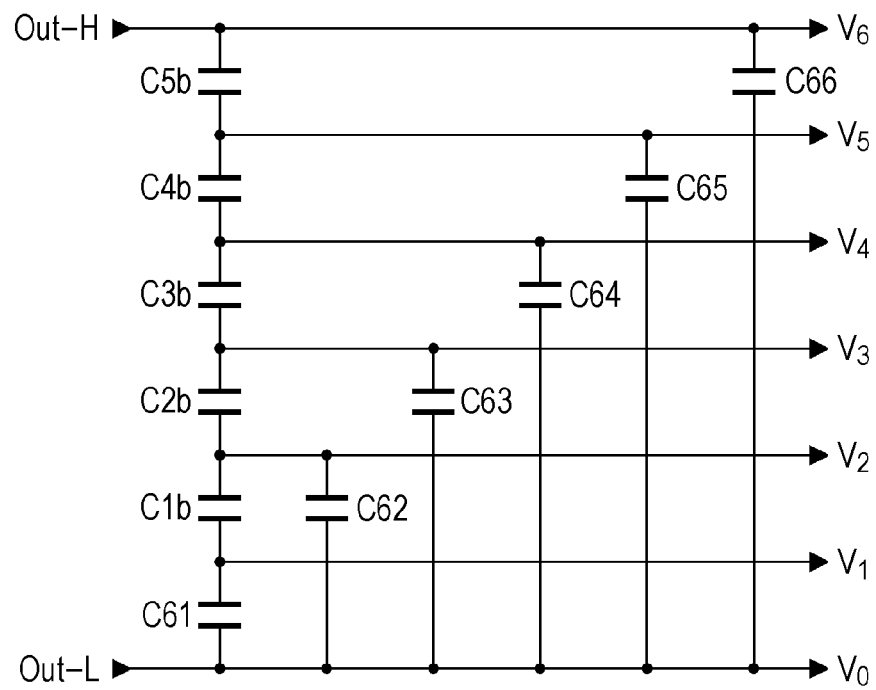
FIGS. 18A and 18B are diagrams illustrating operations of the second CP circuit.
Figure 18B:
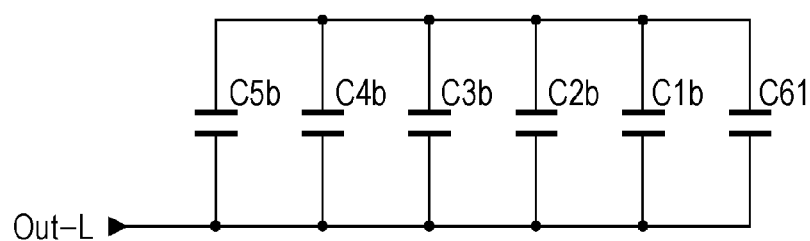

FIGS. 18A and 18B are diagrams illustrating the connection status of the switches in the second CP circuit 52.

In the status A, while the capacitive elements C5b, C4b, C3b, C2b, C1b, and C61 are connected in series between the output terminals Out-H and Out-L of the switching device 53S, in the status B, the capacitive elements C5b, C4b, C3b, C2b, C1b, and C61 are connected in parallel.

Therefore, the switches Sw2d, Sw2u, Sw3d, Sw3u, Sw4d, Sw4u, Sw5d, Sw5u, Sw6d, and Sw6u in FIG. 17 function as a second switching section that switches between the series connection and the parallel connection of the capacitive elements C5b, C4b, C3b, C2b, C1b, and C61 in the second CP circuit 52.

When the statuses A and B are repeated alternately, the voltage equalized in the status B is increased one to six times by the series connection of the status A and the voltages are held respectively in the capacitive elements C61 to C66. These hold voltages are supplied to the drivers 30 as the voltages $V_1$ to $V_6$. The voltage of the output terminal Out-L of the switching device 53S itself is supplied to the driver 30 as voltage $V_0$.

When the piezoelectric element 40 is charged by the driver 30, the hold voltage is lowered in some of the capacitive elements C62 to C66 in the second CP circuit 52. However, the capacitive element, in which the hold voltage is lowered, is replenished with a charge from the power supply by the series connection of the status A, and is redistributed and equalized by the parallel connection of the status B.

Meanwhile, when the piezoelectric element 40 is discharged by the driver 30, the hold voltage is increased in some of the capacitive elements C61 to C66. However, the charge is discharged by the series connection of the status A, and is redistributed and equalized by the parallel connection of the status B.

Accordingly, the charge discharged from the piezoelectric element 40 is collected in the second CP circuit 52 and is reused as the charge for charging the piezoelectric element 40.

The voltage that is supplied to the second CP circuit 52 from the switching device 53S is switched to either the higher-side voltage set (Vp and 2Vp/5) or the lower-side voltage set (3Vp/5 and G), but in the present embodiment, the difference is 3Vp/5 in any case, and thus a configuration in which no change occurs regardless of the switching is obtained.

If the difference between the voltage sets which are supplied to the second CP circuit 52 from the switching device 535 is switched and changed in a configuration, the charge moves in the second CP circuit 52 by the switching. Since the movement of the charge means an occurrence of loss in an equalizer circuit element, power is wasted.

According to the present embodiment, when the difference between the voltage sets which are supplied to the second CP circuit 52 from the switching device 535 is not changed by the switching in a configuration, the charge does not move in the second CP circuit 52 by the switching. Therefore, it is possible to suppress the waste of the power due to the movement of the charge.

According to the present embodiment, a configuration is formed in which, in order not to cause the difference between the voltage sets that are supplied to the second CP circuit 52 from the switching device 535 to be changed by the switching, the power supply voltages (Vp and G) are equally divided and a voltage to be used as the higher-side voltage set and a voltage to be used as the lower-side voltage set are selected from the equally divided voltages in the first CP circuit 51.

In general, when the capacity of the capacitive load such as the piezoelectric element 40 is represented by C and the voltage amplitude is represented by E, energy P accumulated in the capacitive load is represented by $P=(C \cdot E^2)/2$ The piezoelectric element 40 is deformed by the energy P and works, and an amount of work of discharging ink is equal to or less than 1% of the energy P. Accordingly, the piezoelectric element 40 can be considered as a simple capacity. When the capacity C is charged with a constant power, the same energy as $(C \cdot E^2)/2$ is consumed by the charge circuit. During discharging, the same energy is also consumed by the discharge circuit.

Figure 20:
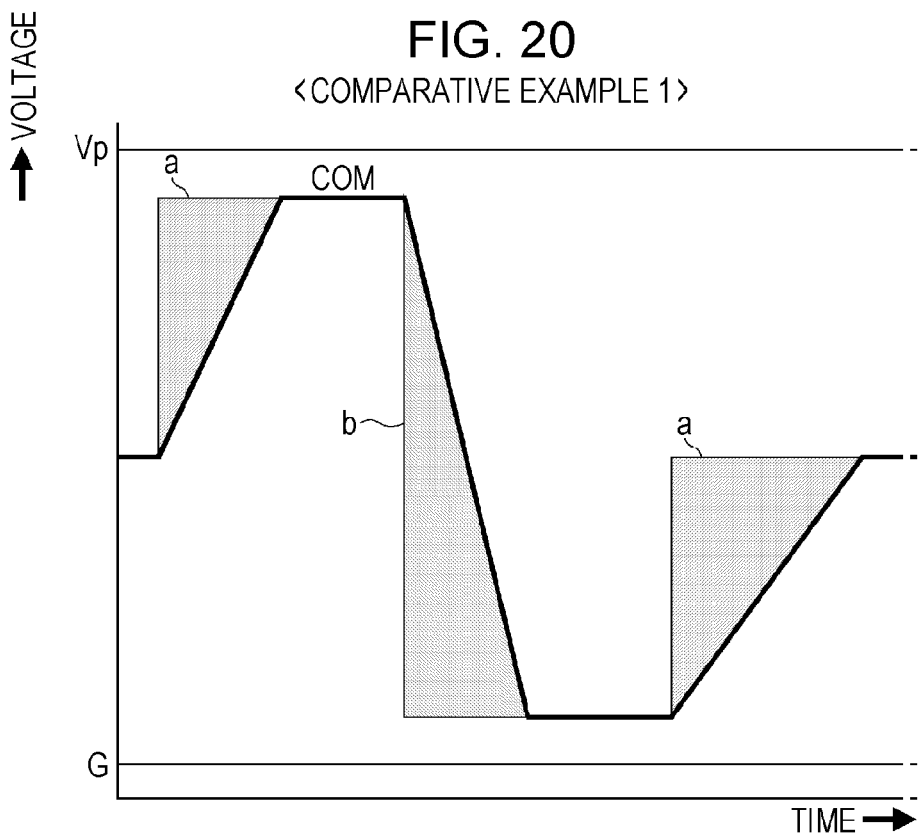
FIG. 20 is a diagram illustrating loss during charging and discharging of a piezoelectric element according to Comparative Example 1.

Here, in a case where the control signal COM (Vin) changes in a range from the voltage Vp to the voltage G, a configuration may be assumed, in which the piezoelectric element 40 is charged and discharged without dividing the voltage (Comparative Example 1). In the Comparative Example 1, a loss during the charging corresponds to the sum of areas of hatched regions a in FIG. 20 and a loss during the discharging corresponds to an area of a hatched region b in FIG. 20.

In contrast, in a case of a first section by the voltage of the control signal COM, the second CP circuit 52 according to the present embodiment divides the voltage into six from the voltage Vp to the voltage 2Vp/5 and supplies the divided voltages as the voltages $V_6$ to $V_0$ to the driver 30. In a case of a second section, the second CP circuit 52 divides the voltage into six from the voltage 3Vp/5 to the voltage G and supplies the divided voltages as the voltages $V_6$ to $V_0$ to the driver 30. In the first section and the second section, the voltages from the voltage 3Vp/5 to the voltage 2Vp/5 are overlapped.

To be more clear, the power supply voltages (Vp and G) are divided into five and switched to three fifths of the higher-side and three fifths of the lower-side. Since three fifths of the voltage is divided into six in the second CP circuit 52, the power supply voltages (Vp and G) are divided into ten as a whole. The driver 30 according to the present embodiment causes the piezoelectric element 40 to be charged and discharged by using the voltages obtained by dividing a range from the voltage Vp to the voltage G into ten.

Figure 19:
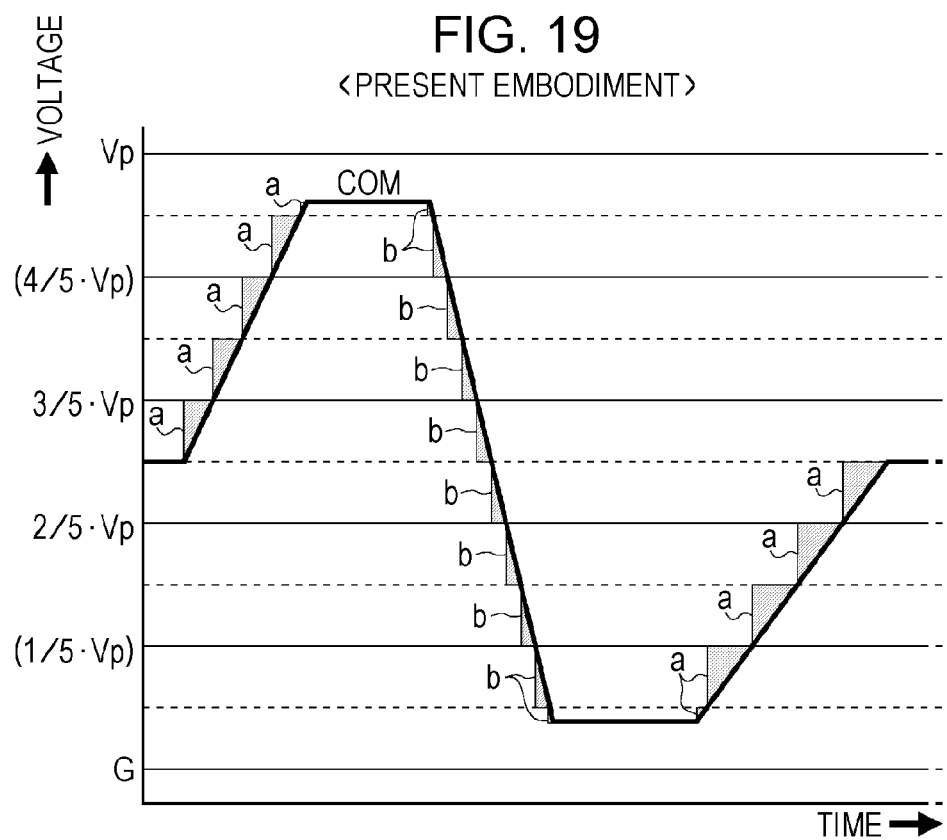
FIG. 19 is a diagram illustrating loss during charging and discharging of a piezoelectric element according to an embodiment.

According to the present embodiment, since the charging and discharging of the piezoelectric element 40 is performed in a stepwise manner, it is possible to suppress the loss during the charging and the loss during the discharging. To be more specific, since the loss during the charging according to the present embodiment corresponds to the sum of areas of hatched regions a in FIG. 19 and the loss during the discharging corresponds to an area of a hatched region b in FIG. 19, it is possible to suppress the losses during the charging and discharging compared to the Comparative Example 1.

Further, according to the present embodiment, since the charge discharged from the piezoelectric element 40 is collected by the second CP circuit 52 and reused during the charging, it is possible to greatly suppress the loss as a whole.

In addition, according to the present embodiment, the voltages $V_6$ to $V_0$ used when the driver 30 causes the piezoelectric element 40 to be charged and discharged are switched between the first section and the second section. Therefore, a range from the voltage Vp to the voltage G is divided into "ten" more than the number of voltage division of "six" by the second CP circuit 52 and the driver 30 causes the piezoelectric element 40 to be charged and discharged using the ten-divided voltages.

Figure 21:
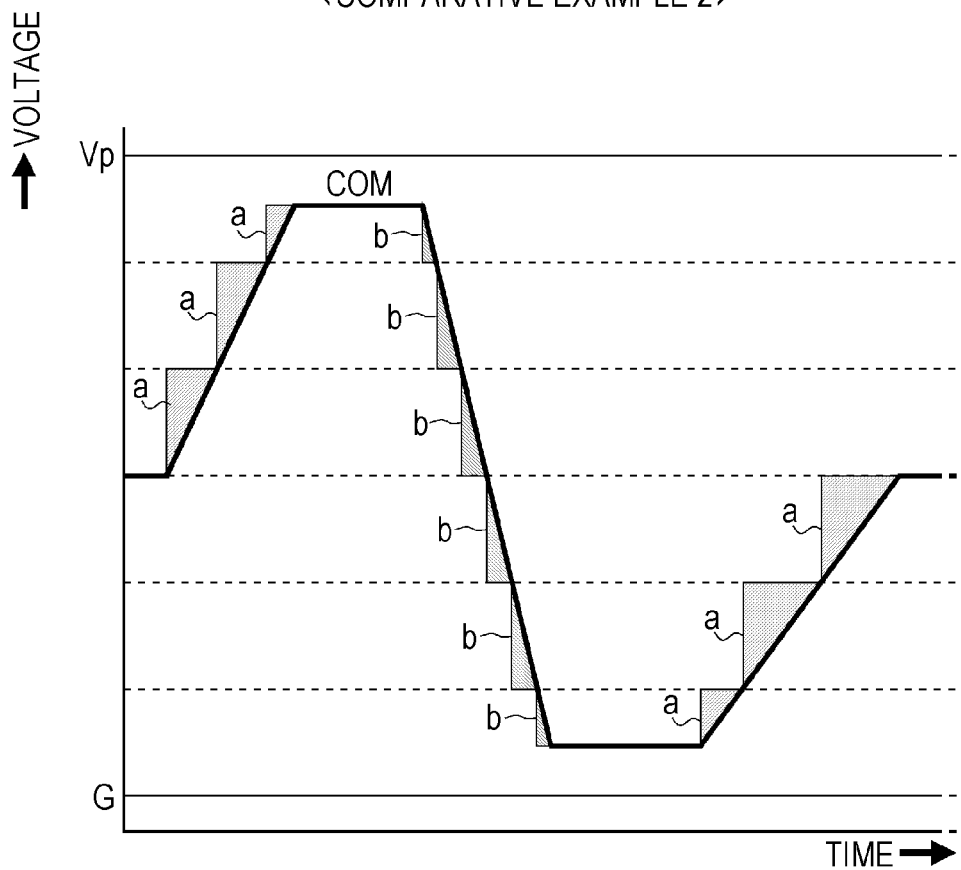
FIG. 21 is a diagram illustrating loss during charging and discharging of a piezoelectric element according to Comparative Example 2.

As Comparative Example 2, a configuration is assumed in which the second CP circuit 52 divides the power supply voltages (Vp and G) without the first CP circuit 51 and the switching device 535. Comparative Example 2 has a configuration in which the range from the voltage Vp to the voltage G is divided into six by the second CP circuit 52 and then supplied to the driver 30. Therefore, according to Comparative Example 2, the driver 30 causes the piezoelectric element 40 to be charged and discharged by using the voltages obtained by dividing the power supply voltages (Vp and G) into six such that the voltage Vout follows the control signal Vin. At this time, the loss during the charging according to Comparative Example 2 corresponds to the sum of areas of hatched regions a in FIG. 21 and the loss during the discharging corresponds to the sum of areas of hatched regions b in FIG. 21. Here, the number of voltage division is less compared to "ten" according to the present embodiment and the sum of the losses is greater compared to the present embodiment. In other words, the present embodiment is superior to Comparative Example 2 in this point.

According to the present embodiment, the higher-side voltage set (Vp and 2Vp/5) and the lower-side voltage set (3Vp/5 and G) are overlapped with each other in a range of the voltages (3Vp/5 and 2Vp/5). That is, a configuration is obtained in which, when switching is performed between one of the first section in which the higher-side voltage set is selected or the second section in which the lower-side voltage set is selected, and to the other according to the voltage of the control signal COM, it is unavoidable to perform the switching through the range where the voltages are overlapped.

In the driver 30 according to the present embodiment, during the increase of the voltage (or voltage Vout) of the control signal Vin, when the voltage of the control signal Vin approaches the voltage $V_6$, the current is unlikely to flow in the transistor 341 in the unit circuit 34f (because the voltage between the base-emitter is low). Similarly, during the drop of the voltage Vin, when the voltage of the control signal Vin approaches the voltage $V_0$, the current is unlikely to flow in the transistor 342 in the unit circuit 34a.

Therefore, in a case where the overlapping range is not provided, the following inconveniences are assumed. That is, in a case where the overlapping range is not provided, the higher-side of the lower-side voltage set and the lower-side of the higher-side voltage set share voltages (boundary voltages). When the control signal Vin over the boundary voltages switches from one of the lower-side voltage set or the higher-side voltage set to the other, the control signal Vin passes through the a state where the current is unlikely to flow in the transistors 341 and 342. Therefore, the following property of the voltage Vout to the control signal Vin is degraded.

According to the present embodiment, the overlapping range is provided in advance, the switching is performed such that a voltage range after the change is maintained during increasing or dropping of the voltage Vin (Vout), and thereby it is possible to avoid degrading the following property of the voltage Vout.

In addition, the voltage Vc is positioned in the overlapping range, and thereby the voltage Vout is caused to follow the voltage Vc regardless of the voltage of the control signal COM even when the switch 232 is in the OFF state, which is as described above.

According to the present embodiment, the power supply voltages (Vp and G) are divided into the larger number than the number of the voltage division of the first CP circuit 51, and thus the low power consumption is achieved. The invention is not limited to the embodiment in the voltage division, and various aspects are considered. Next, the aspects of the voltage division are examined.

Figure 22:
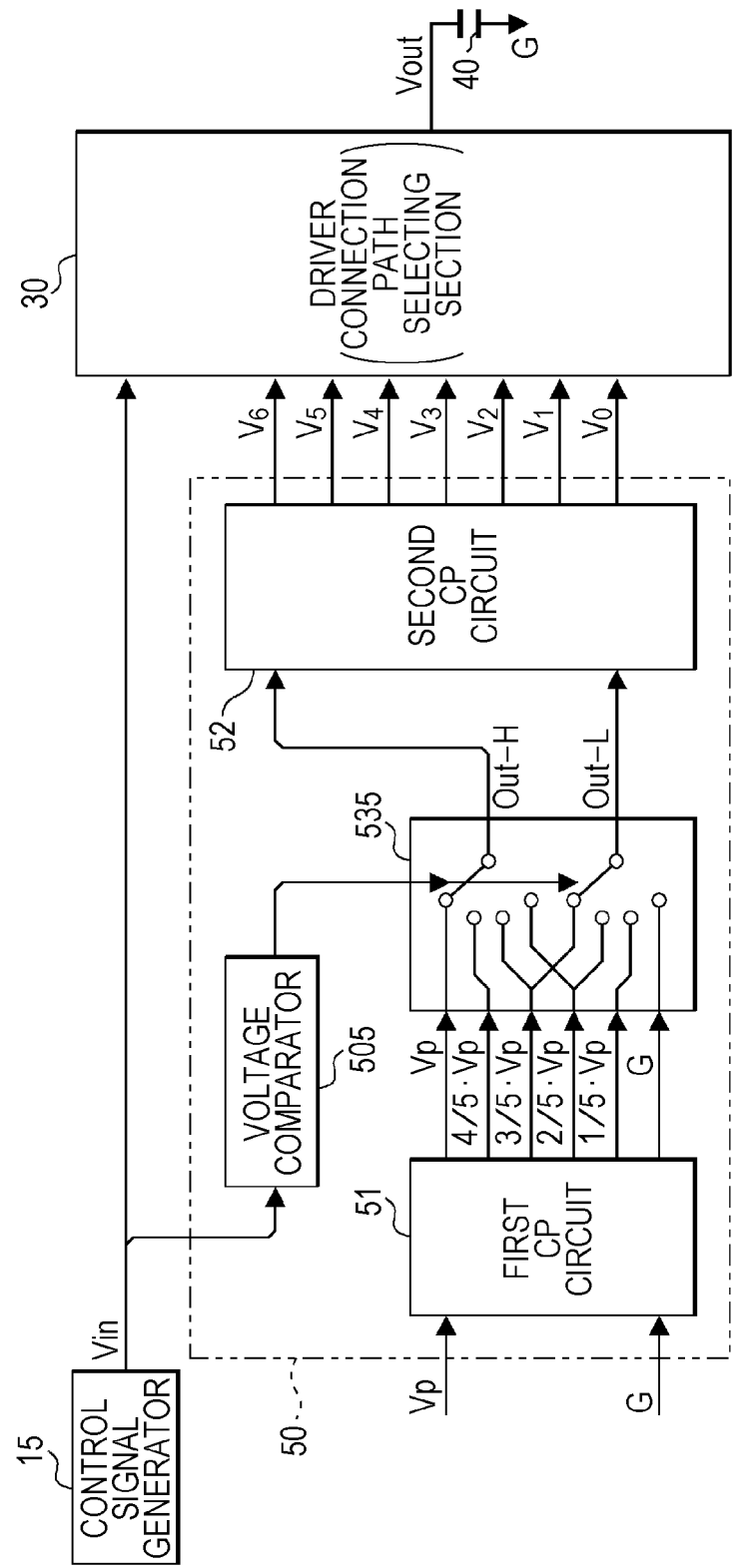
FIG. 22 is a block diagram illustrating a configuration of main components of a printing apparatus according to Application Example (1).

FIG. 22 is a block diagram illustrating a configuration of main components of the printing apparatus 1 according to Application Example (1) when focused on one set of the driver 30 and the piezoelectric element 40.

In the printing apparatus 1, a configuration is described, in which only the first CP circuit 51 of the auxiliary power supply circuit 50 is shared by a plurality of sets of the drivers 30 and the piezoelectric elements 40 and the switching device 535 and the second CP circuit 52 are not shared by the plurality of sets of the drivers 30 and the piezoelectric elements 40, that is, a configuration in which a set of the driver 30 and the piezoelectric element 40 corresponds to a set of the switching device 535 and the second CP circuit 52. In connection with this, it is considered that, as one block including not only the main controller 120 and DAC 160, but also the selection section 230 (switch 232), the control signal generator 15 outputs the control signal Vin.

In FIG. 22, the first CP circuit 51 performs output with respect to the voltage 4Vp/5 and the voltage Vp/5 which are not used in the present embodiment. In addition, the switching device 535 is a two-pole four-throw switch and thus selects any one of a first set of the voltages (Vp and 3Vp/5), a second set of the voltages (4Vp/5 and 2Vp/5), a third set of the voltages (3Vp/5 and Vp/5), or a fourth set of the voltages (2Vp/5 and G) by an instruction of the voltage comparator 505.

Each of the voltages from the first set to the fourth set is a voltage corresponding to two fifths of the power supply voltages (Vp and G).

To be more clear, according to Application Example (1), two fifths of the voltages from the first set to the fourth set are overlapped by a fifth and switched according to the voltage of the control signal Vin. Since two fifths of the voltages are divided into six by the second CP circuit 52 similar to the embodiment, the power supply voltages (Vp and G) are divided into 15 as a whole (refer to FIG. 23).

In FIG. 22, when the voltage of the control signal Vin becomes equal to or higher than the voltage 3Vp/5 with respect to the switching device 535, the voltage comparator 505 issues an instruction of selecting the first set of the voltages (Vp and 3Vp/5). When the voltage of the control signal Vin becomes equal to or higher than the voltage 2Vp/5 and less than the voltage 4Vp/5, the voltage comparator 505 issues an instruction of selecting the second set of the voltages (4Vp/5 and 2Vp/5). When the voltage of the control signal Vin becomes equal to or higher than the voltage Vp/5 and less than the voltage 3Vp/5, the voltage comparator 505 issues an instruction of selecting the third set of the voltages (3Vp/5 and Vp/5). When the voltage of the control signal Vin becomes less than the voltage 3Vp/5 (equal to or higher than voltage G), the voltage comparator 505 issues an instruction of selecting the fourth set of the voltages (2Vp/5 and G).

The voltage comparator 505 that switches between the connections of the first CP circuit 51 with the second CP circuit 52 has the hysteresis characteristic in voltage determination of the control signal Vin. Specifically, as described above, the threshold value used when the voltage of the control signal Vin is increased is set to be higher than the threshold value used when the voltage of the control signal Vin is dropped.

FIGS. 24A to 25D are diagrams illustrating connections of the first CP circuit 51 with the second CP circuit 52 according to Application Example (1).

Figure 24A:
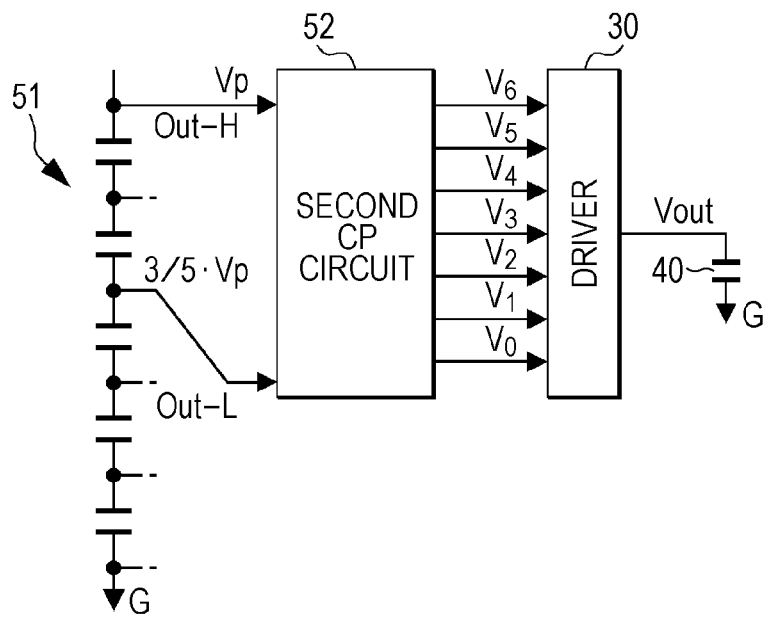
FIGS. 24A and 24B are diagrams illustrating connections in the auxiliary power supply circuit according to Application Example (1).

In Application Example (1), in the first section, in the switching device 535, the output terminal Out-H has the voltage Vp and the output terminal Out-L has the voltage 3Vp/5. Therefore, the first CP circuit 51 and the second CP circuit 52 are in the connection status as illustrated in FIG. 24A.

Figure 24B:
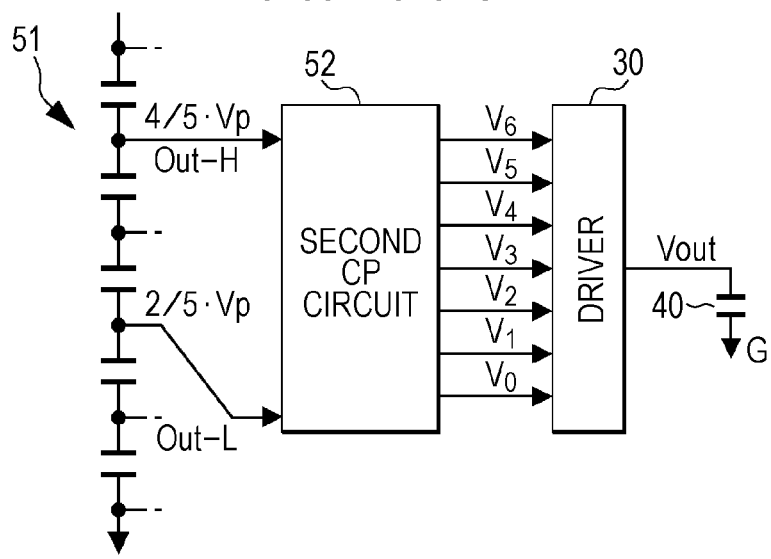

In addition, in the second section, in the switching device 535, the output terminal Out-H has the voltage 4Vp/5 and the output terminal Out-L has the voltage 2Vp/5. Therefore, the first CP circuit 51 and the second CP circuit 52 are in the connection status as illustrated in FIG. 24B.

Figure 25C:
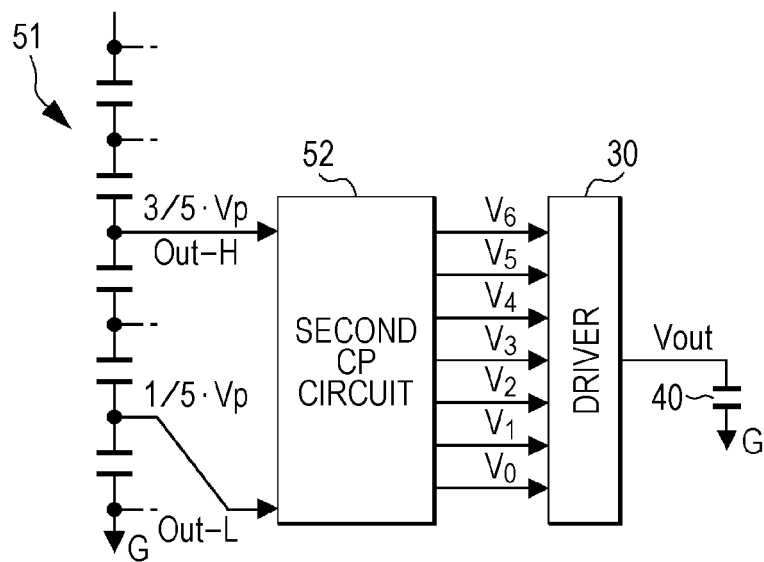
FIGS. 25C and 25D are diagrams illustrating connections in the auxiliary power supply circuit according to Application Example (1).

In the third section, in the switching device 535, the output terminal Out-H has the voltage 3Vp/5 and the output terminal Out-L has the voltage Vp/5. Therefore, the first CP circuit 51 and the second CP circuit 52 are in the connection status as illustrated in FIG. 25C.

Figure 25D:
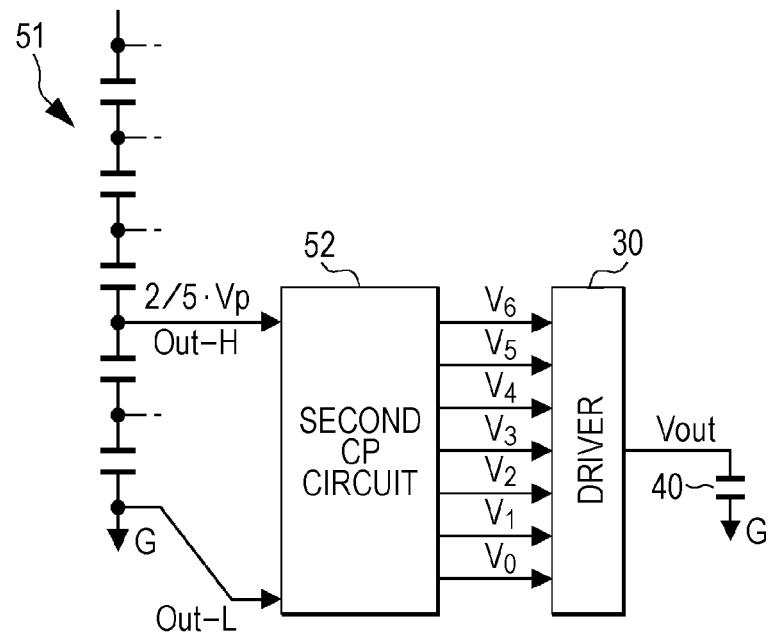

In the fourth section, in the switching device 535, the output terminal Out-H has the voltage 2Vp/5 and the output terminal Out-L has the voltage G. Therefore, the first CP circuit 51 and the second CP circuit 52 are in the connection status as illustrated in FIG. 25D.

Figure 23:
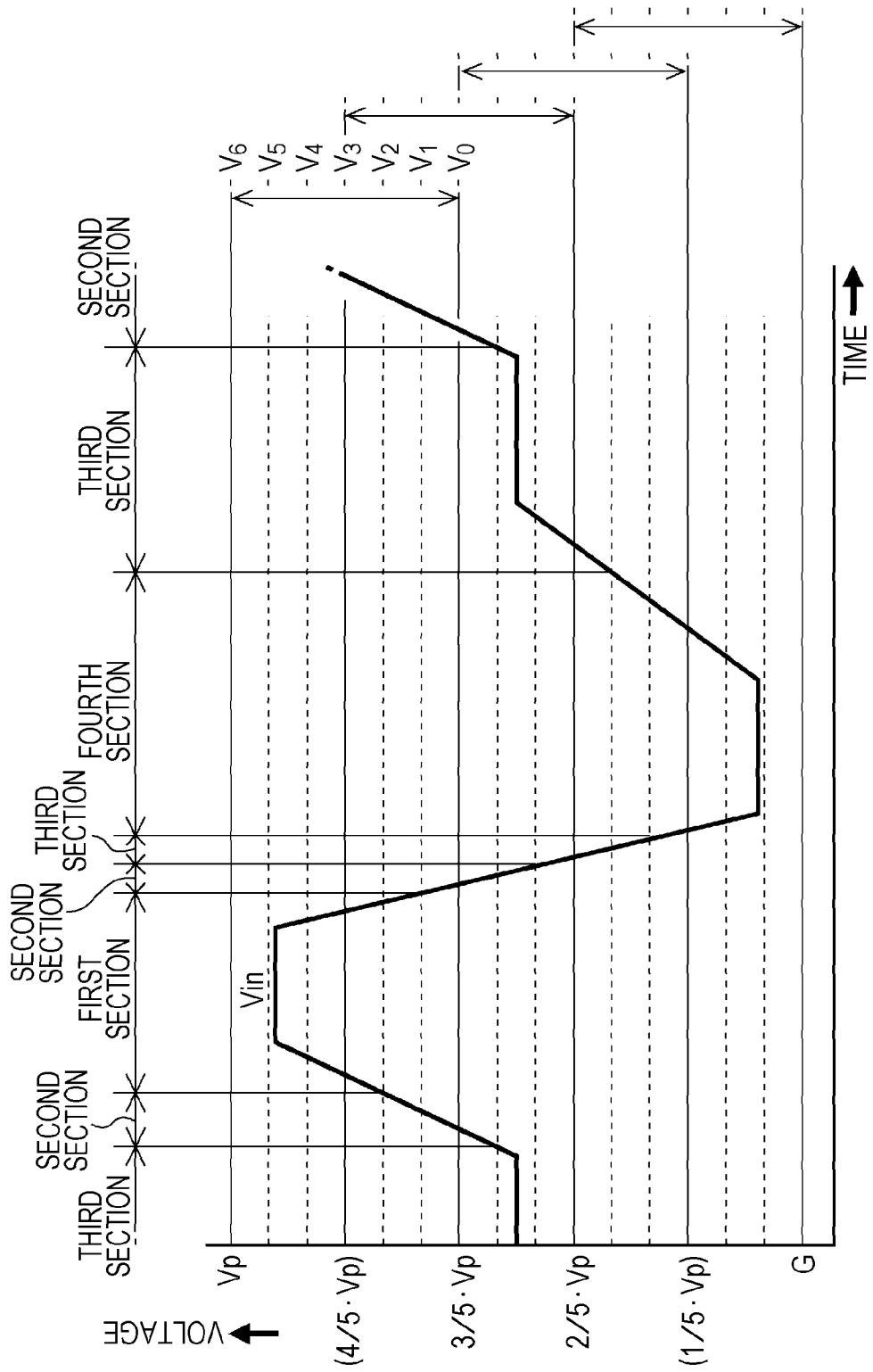
FIG. 23 is a diagram illustrating an operation or the like of an auxiliary power supply circuit according to Application Example (1).

FIG. 23 is a diagram illustrating an operation of the auxiliary power supply circuit 50 at the voltage of the control signal Vin. Since the description is the same as in FIG. 5, the details are not described. The driver 30 causes the piezoelectric element 40 to be charged and discharged by using the voltages obtained by dividing the power supply voltages (Vp and G) into 15.

In FIG. 23, a period of time in which the voltages of the first set are selected is set as the first section and a period of time in which the voltages of the second to fourth sets are selected are set as the second to fourth sections.

According to Application Example (1), the number of the voltage division is increased from "10" to "15", and thus the low power consumption is achieved.

According to Application Example (1), the switching device and the second CP circuit 52 are described as corresponding to one set of the driver 30 and the piezoelectric element 40. Similar to the embodiment, the switching device and the second CP circuit 52 can also be configured to correspond to the plurality of sets of the drivers 30 and the piezoelectric elements 40.

However, the following restrictions are accompanied, that is, since the same voltage set is supplied to the plurality of drivers 30 in the configuration in which the switching device 535 and the second CP circuit 52 correspond to the plurality of sets of the drivers 30 and the piezoelectric elements 40, it is not possible to cause the plurality of piezoelectric elements 40 to be charged or discharged independently from each other. Further, the switching device 535 and the second CP circuit 52 can be configured to correspond to the plurality of sets of the drivers 30 and the piezoelectric elements 40 under a condition that a plurality of drive signals COM is prepared and the same drive signal is used to the drivers 30 that share the second CP circuit 52.

Figure 26:
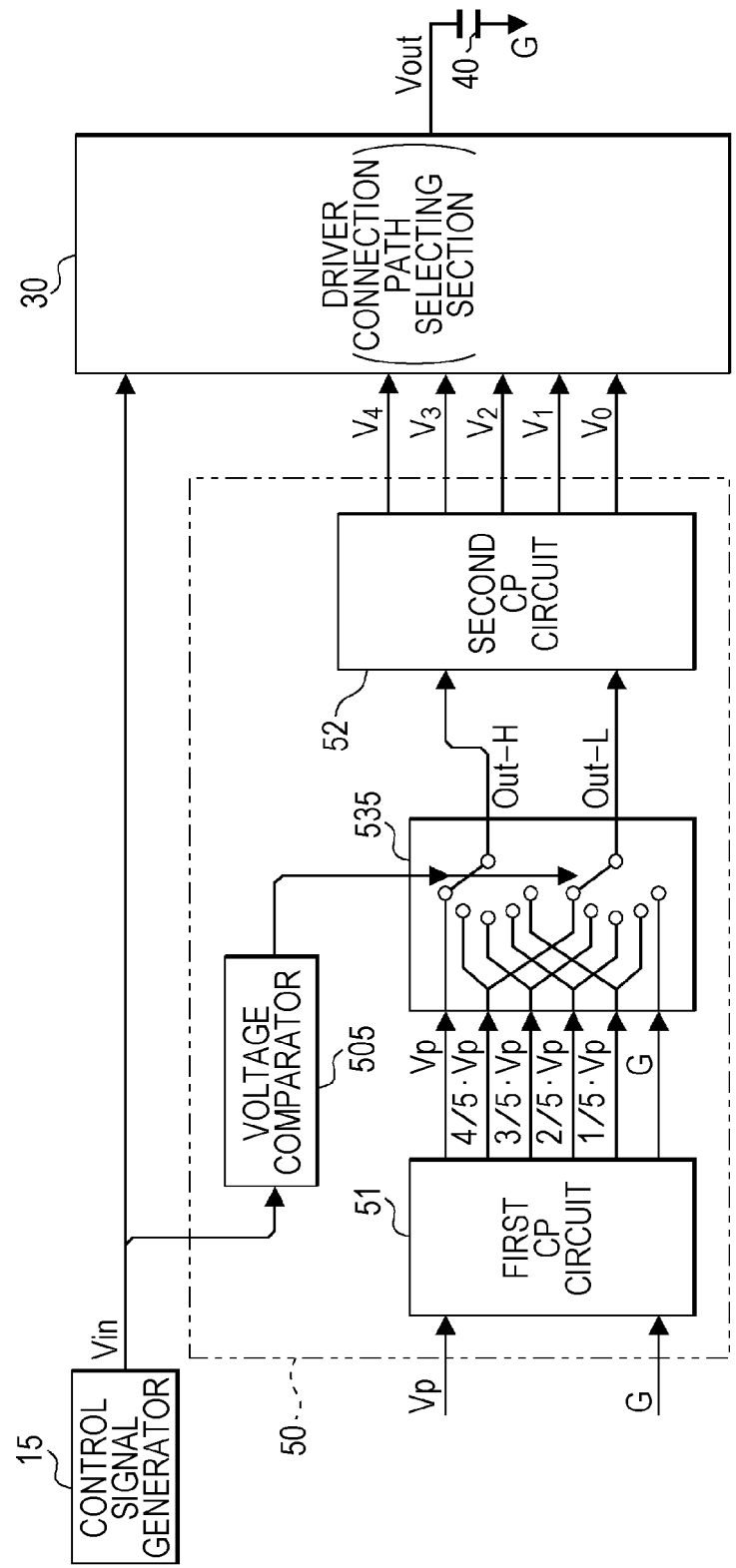
FIG. 26 is a block diagram illustrating a configuration of main components of a printing apparatus according to Application Example (2).

FIG. 26 is a block diagram illustrating a configuration of main components in the printing apparatus 1 according to Application Example (2) when focused on one set of the driver 30 and the piezoelectric element 40.

The printing apparatus 1 has a configuration in which, similar to Application Example (1), one set of the switching device 535 and the second CP circuit 52 corresponds to one set of the driver 30 and the piezoelectric element 40 and, as one block including the main controller 120, the DAC 160, and the selection section 230 (switch 232), the control signal generator 15 outputs the control signal Vin.

Similar to Application Example (1), the first CP circuit 51 outputs the voltage 4Vp/5 and the voltage Vp/5 which are not used in the embodiment.

In addition, the switching device 535 is a two-pole five-throw switch and thus selects any one of a first set of the voltages (Vp and 2Vp/5), a second set of the voltages (4Vp/5 and 3Vp/5), a third set of the voltages (3Vp/5 and 2Vp/5), a fourth set of the voltages (2Vp/5 and Vp/5) or a fifth set of the voltages (Vp/5 and G) by an instruction of the voltage comparator 505.

Each of the voltages from the first set to the fifth set is a voltage corresponding to a fifth of the power supply voltages (Vp and G).

The second CP circuit 52 according to Application Example (2) is different from that according to the embodiment and Application Example (1) as follows. That is, the second CP circuit 52 according to the embodiment and Application Example (1) is configured to divide the voltages of the terminals Out-H and Out-L of the switching device 535 into six, and the second CP circuit 52 according to Application Example (2) is configured to cause the voltages of the terminals Out-H and Out-L to be increased 4/3 times and divide the result into four. In other words, the second CP circuit 52 according to Application Example (2) is configured to divide the voltages of the terminals Out-H and Out-L into three and output a voltage of a third step high on the higher-side.

In addition, the number of the unit circuits 34 in the driver 30 is reduced from "6" to "4" in accordance with the change of the second CP circuit 52. Since the details of the driver 30 in which the stages are reduced to four can be inferred by FIG. 7, the description thereof is omitted.

To be more clear, according to Application Example (2), a fifth of the voltages from the first set to the fifth set are overlapped by a third step and switched according to the voltage of the control signal Vin. A fifth of the voltages are caused to become 4/3 times as high and are divided into four. However, since a third of the voltages are overlapped, the power supply voltages (Vp and G) are divided into 15 as a whole, similar to Application Example (1) (refer to FIG. 27).

In FIG. 26, when the voltage of the control signal Vin becomes equal to or higher than the voltage 4Vp/5 (less than the voltage Vp) with respect to the switching device 535, the voltage comparator 505 issues an instruction of selecting the first set of the voltages (Vp and 4Vp/5). When the voltage of the control signal Vin becomes equal to or higher than the voltage 2Vp/5 and less than the voltage 4Vp/5, the voltage comparator 505 issues an instruction of selecting the second set of the voltages (4Vp/5 and 3Vp/5). When the voltage of the control signal Vin becomes equal to or higher than the voltage 3Vp/5 and less than the voltage 3Vp/5, the voltage comparator 505 issues an instruction of selecting the third set of the voltages (3Vp/5 and 2Vp/5). When the voltage of the control signal Vin becomes equal to or higher than the voltage Vp/5 and less than the voltage 2Vp/5, the voltage comparator 505 issues an instruction of selecting the fourth set of the voltages (2Vp/5 and Vp/5). When the voltage of the control signal Vin becomes less than the voltage Vp/5 (equal to or higher than voltage G), the voltage comparator 505 issues an instruction of selecting the fifth set of the voltages (Vp/5 and G).

The voltage comparator 505 that switches between the connections of the first CP circuit 51 with the second CP circuit 52 has the hysteresis characteristic in the voltage determination of the control signal Vin. Specifically, as described above, the threshold value used when the voltage of the control signal Vin is increased is set to be greater than the threshold value used when the voltage of the control signal Vin is dropped.

FIGS. 28A to 30E are diagrams illustrating connections of the first CP circuit 51 with the second CP circuit 52 according to Application Example (2).

Figure 28A:
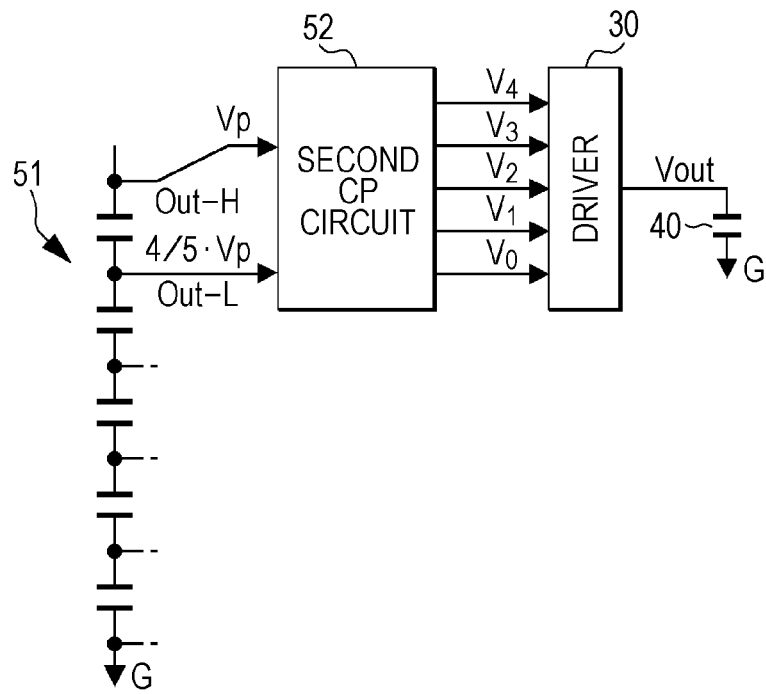
FIGS. 28A and 28B are diagrams illustrating connections in the auxiliary power supply circuit according to Application Example (2).

In Application Example (2), in the first section, in the switching device 535, the output terminal Out-H has the voltage Vp and the output terminal Out-L has the voltage 4Vp/5. Therefore, the first CP circuit 51 and the second CP circuit 52 are in the connection status as illustrated in FIG. 28A.

Figure 28B:
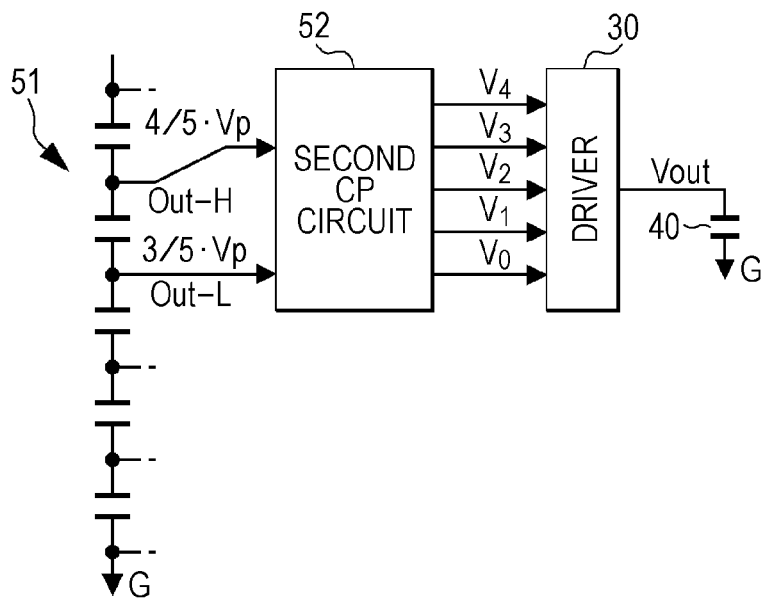

In addition, in the second section, in the switching device 535, the output terminal Out-H has the voltage 4Vp/5 and the output terminal Out-L has the voltage 3Vp/5. Therefore, the first CP circuit 51 and the second CP circuit 52 are in the connection status as illustrated in FIG. 28B.

Figure 29C:
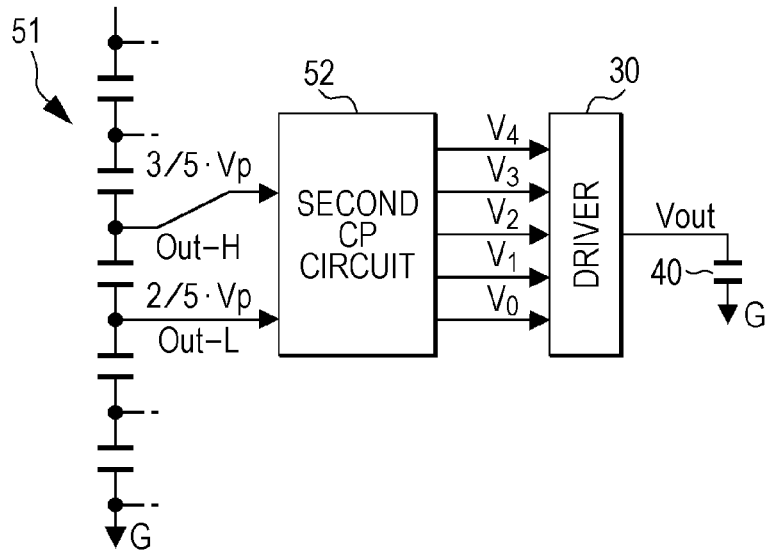
FIGS. 29C and 29D are diagrams illustrating connections in the auxiliary power supply circuit according to Application Example (2).

In the third section, in the switching device 535, the output terminal Out-H has the voltage 3Vp/5 and the output terminal Out-L has the voltage 2Vp/5. Therefore, the first CP circuit 51 and the second CP circuit 52 are in the connection status as illustrated in FIG. 29C.

Figure 29D:
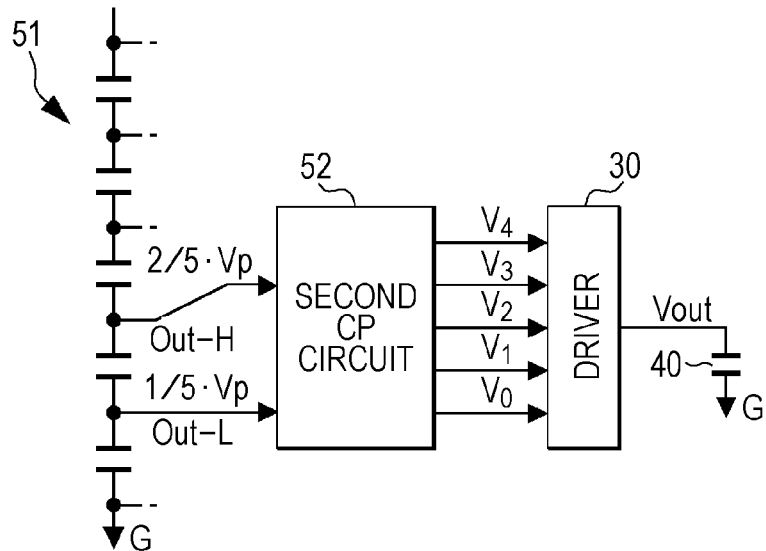

In the fourth section, in the switching device 535, the output terminal Out-H has the voltage 2Vp/5 and the output terminal Out-L has the voltage Vp/5. Therefore, the first CP circuit 51 and the second CP circuit 52 are in the connection status as illustrated in FIG. 29D.

Figure 30E:
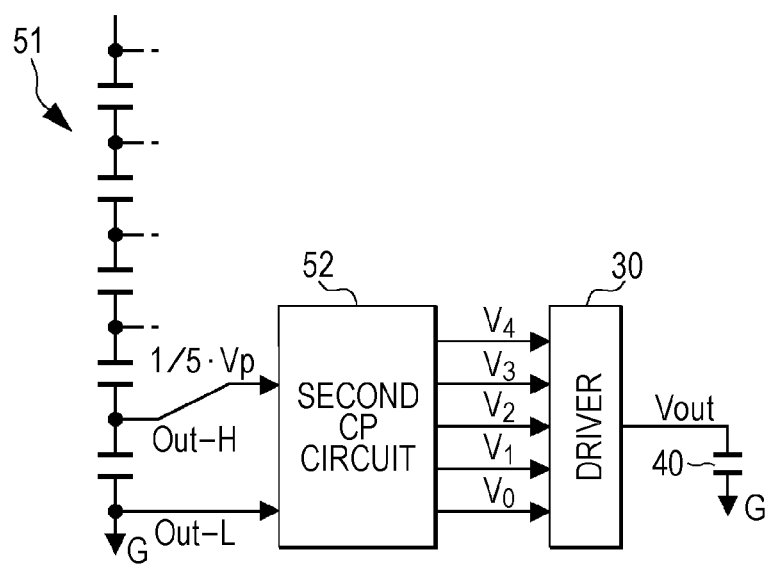
FIG. 30E is a diagram illustrating connections in the auxiliary power supply circuit according to Application Example (2).

In the fifth section, in the switching device 535, the output terminal Out-H has the voltage Vp/5 and the output terminal Out-L has the voltage G. Therefore, the first CP circuit 51 and the second CP circuit 52 are in the connection status as illustrated in FIG. 30E.

The first CP circuit 51 according to Application Example (2) is substantially the same as that according to the embodiment or Application Example (1), but the configuration of the second CP circuit 52 is slightly different from the others.

The second CP circuit 52 according to Application Example (2) is described in a confirmatory manner.

Figure 31:
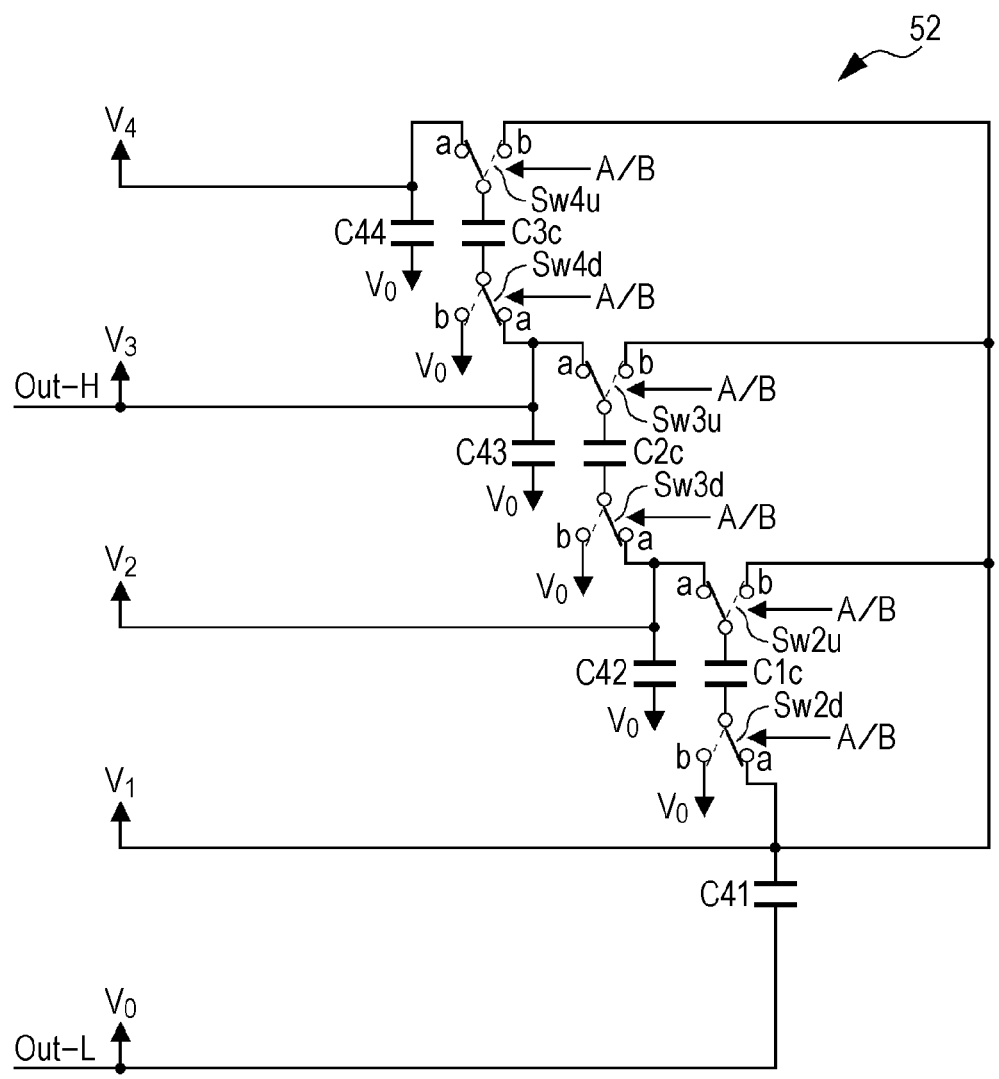
FIG. 31 is a diagram illustrating an example of a configuration of a second CP circuit according to Application Example (2).

FIG. 31 is a diagram illustrating an example of a configuration of the second CP circuit 52 that is applied to Application Example (2).

As illustrated in FIG. 31, the second CP circuit 52 is configured to have switches Sw2d, Sw2u, Sw3d, Sw3u, Sw4d, and Sw4u, and capacitive elements C41, C42, C43, C44, C1c, C2c, C3c. The second CP circuit 52 is configured to have a total of three stages of two stages for dividing the voltages of terminals Out-H and Out-L into three and holding the divided results and a stage for shifting the voltages of terminals Out-H and Out-L on the higher-side than the voltage of the terminal Out-H and holding the shifted result.

Figure 32A:
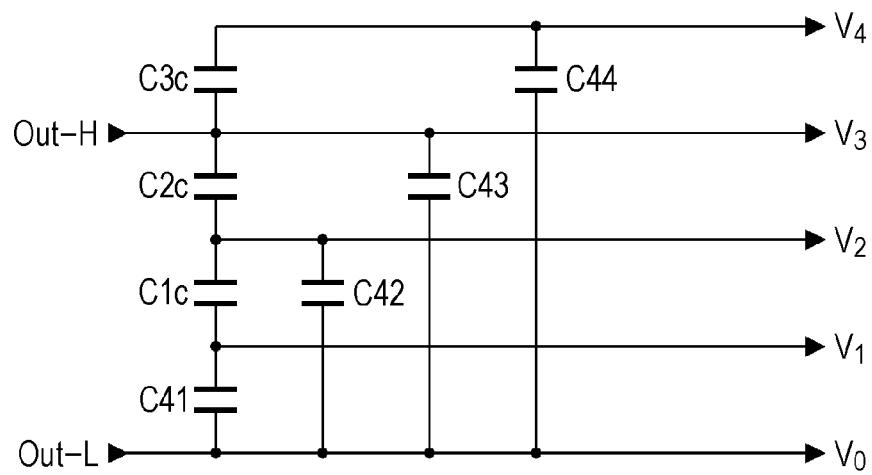
FIGS. 32A and 32B are diagrams illustrating operations of the second CP circuit.
Figure 32B:
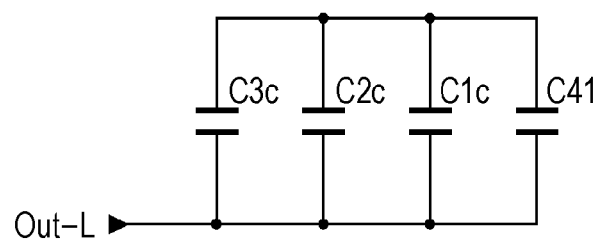

FIGS. 32A and 32B are diagrams illustrating the connection status of the switches in the second CP circuit 52.

In the status A, while the capacitive elements C3c, C2c, C1c, and C41 are connected in series between the output terminals Out-H and Out-L of the switching device 535, in the status B, the capacitive elements C3c, C2c, C1c, and C41 are connected in parallel.

When the statuses A and B are repeated alternately, the voltage equalized in the status B is increased one to four times by the series connection of the status A and the voltages are held respectively in the capacitive elements C41 to C44. These hold voltages are supplied to the drivers 30 as the voltages $V_1$ to $V_4$.

FIG. 27 is a diagram illustrating an operation of the auxiliary power supply circuit 50 at the voltage of the control signal Vin. Since the description is the same as in FIGS. 5 and 23, the details are not described. The driver 30 causes the piezoelectric element 40 to be charged and discharged by using the voltages obtained by dividing the power supply voltages (Vp and G) into 15.

In FIG. 27, a period of time in which the voltages of the first set are selected is set as the first section and a period of time in which the voltages of the second to fifth sets are selected is set as the second to fifth sections.

According to Application Example (2), similar to Application Example (1), the number of the voltage division is increased from "10" to "15", and thus the lower power consumption is achieved compared to the embodiment.

According to Application Example (2), the number of voltage division itself is the same as Application Example (1) as "15", but the overlapped voltage range is narrowed to a third and thus the number of the output voltages of the second CP circuit 52 and the number of unit circuits 34 in the driver 30 are each decreased to two thirds. Particularly, since the driver 30 is provided for each nozzle, the configuration is simplified and it is possible to lower a cost greatly.

Application Example and Modification Example

The invention is not limited to the above described embodiments, but can be subjected to various applications and modifications as will be described later. Aspects of the applications and modifications which will be described later may be used as one aspect selected randomly or a plurality of the aspects selected randomly may be appropriately combined.

Duplicating Operation of Unit Circuit

In the driver 30 described above, in a case where the voltage Vout approaches the voltage $V_6$ during the increase of the voltage of the control signal Vin, or in a case where the voltage Vout approaches the voltage $V_0$ during the drop of the voltage Vin, the current is unlikely to flow in the transistors 341 and 342. In addition, in the driver 30, not only in these cases, but also in a case where the voltage Vout approaches the voltages $V_1$, $V_2$, $V_3$, $V_4$, and $V_5$, similarly, the current is unlikely to flow in the transistors 341 and 342.

Application Example (3) in which the state is improved is described.

Figure 33:
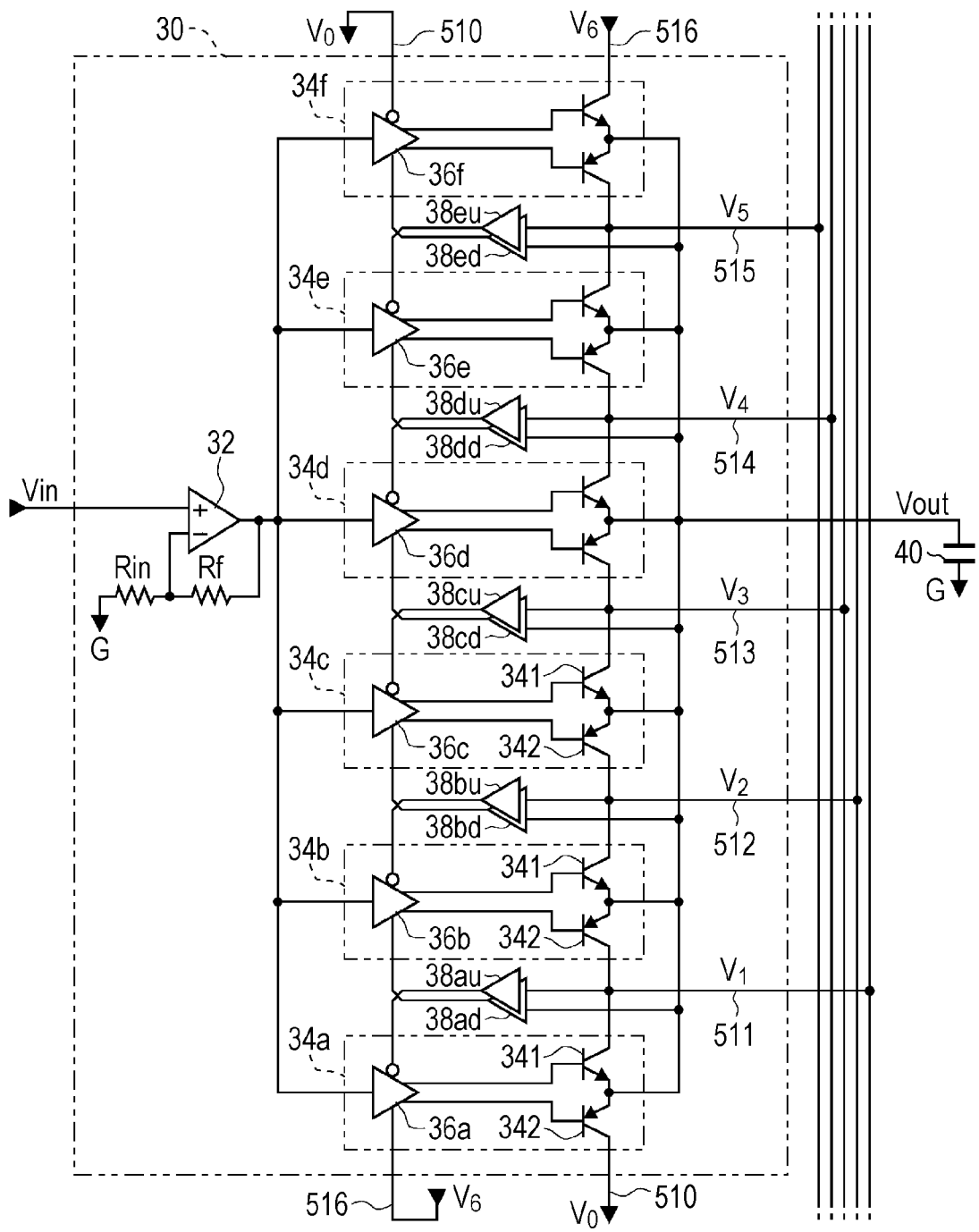
FIG. 33 is a diagram illustrating an example of a configuration of a driver according to Application Example (3).

FIG. 33 is a diagram illustrating a configuration of the driver 30 according to Application Example (3). In the driver 30 illustrated in FIG. 33, the comparators 38a to 38e in FIG. 7 are each divided into two comparators. That is, in FIG. 33, comparators 38au, 38ad, 38bu, 38bd, 38cu, 38cd, 38du, 38dd, 38eu, and 38ed are included.

Here, the first reference signs a to e immediately after the reference sign 38 of the comparator indicate that a is associated with the voltage $V_1$ and b to e are associated with the voltages $V_2$, $V_3$, $V_4$, and $V_5$. For example, a pair of comparators 38ad and 38au is associated with the voltage $V_1$ and, for example, a pair of comparators 38bd and 38bu is associated with the voltage $V_2$.

Further, a pair of comparators includes one comparator corresponding to a lower-side threshold voltage which is lower than the associated voltage by α and one comparator corresponding to a higher-side threshold voltage which is higher by α. That is, the second reference signs d and u immediately after the reference sign 38 of the comparator indicate that d corresponds to the lower-side threshold voltage and u corresponds to the higher-side threshold voltage.

Accordingly, for example, the comparator 38au indicates that the comparator corresponds to a higher-side threshold voltage which is higher than the voltage $V_1$ by α and the comparator 38bd indicates that the comparator corresponds to a lower-side threshold voltage which is lower than the voltage $V_2$ by α.

When the comparator is described not specifically but generally, the description is provided without a reference sign. When, in an input end, the voltage Vout of one end is equal to or higher than the threshold voltage of the other end, each comparator outputs an H-level signal and when the voltage Vout is less than the threshold voltage of the other end, each comparator outputs an L-level signal. Specifically, for example, when the voltage Vout is equal to or higher than the threshold voltage ($V_1-\alpha$), the comparator 38ad outputs H-level signal and when the voltage Vout is less than the threshold voltage ($V_1-\alpha$), the comparator 38ad outputs the L-level signal. In addition, for example, when the voltage Vout is equal to or higher than the threshold voltage ($V_2+\alpha$), the comparator 38bu outputs the H-level signal and when the voltage Vout is less than the threshold voltage ($V_2+\alpha$), the comparator 38bu outputs the L-level signal.

When the control signal Vin is equal to or higher than the voltage ($V_1-\alpha$) and less than ($V_1+\alpha$), the unit circuits 34a and 34b corresponding to the voltage $V_1$ are in the enable status. Accordingly, in this case, when the control signal Vin exceeds the voltage Vout, the transistor 341 of the unit circuit 34a causes the current to flow to one end of the piezoelectric element 40 through the wire 511 and the transistor 341 of the unit circuit 34b causes the current to flow to one end of the piezoelectric element 40 through the wire 512. In addition, in this case, when the control signal Vin is less than the voltage Vout, the transistor 342 of the unit circuit 34a causes the current to flow to one end of the piezoelectric element 40 through the wire 510 and the transistor 341 of the unit circuit 34b causes the current to flow to one end of the piezoelectric element 40 through the wire 511.

When the piezoelectric element 40 is charged, the wires that supply the charge have an overlapping portion by two paths in a part, but, similar to the embodiment, basically switch in the order of the wires 511, 512, 513, 514, 515, and 516.

FIGS. 34A and 34B are diagrams illustrating examples of setting of input-output characteristics of transistors of which, particularly, the transistors 341 and 342 of the unit circuits 34a and 34b are representative. In FIGS. 34A and 34B, H is a portion in which the control signal Vin that is an input signal of the driver 30 matches the voltage Vout that is the output.

FIG. 34A illustrates an example of a case of setting a region where the control signal Vin is lower than the voltage (Vout−β) within a region in which the transistor 341 is in the ON state and where the control signal Vin is higher than the voltage (Vout+β) within a region where the transistor 342 is in the ON state. In this example, when a difference between the voltage of the control signal Vin and the voltage Vout is within β by control of the voltage Vout to follow the control signal Vin, both of the transistors 341 and 342 are in the OFF state. Therefore, since a state in which a through-current flows between the wires which supply the voltage $V_1$ to the voltage $V_5$ is avoided, it is advantageous in terms of the power consumption.

On the other hand, since a region (dead zone) exists in which the transistors 341 and 342 are in the OFF state and thus the current control is not performed, the following property of the voltage Vout to the control signal Vin is degraded. However, when the voltage runs over the wires 511 to 515, two transistors are in the ON state. Therefore, an occurrence of a level difference in the voltage Vout is suppressed.

In FIG. 34A, in a state in which the voltage Vout is equal to or higher than the threshold voltage $(V_1-\alpha)$ less than $(V_1+\alpha)$, when the control signal Vin is lower than the (Vout$-\beta$), both of the transistor 341 of the unit circuit 34a and the transistor 341 of the unit circuit 34b are in the ON state, and when the control signal Vin is lower than the (Vout$+\beta$), both of the transistor 342 of the unit circuit 34a and the transistor 342 of the unit circuit 34b are in the ON state.

In addition, FIG. 34B illustrates an example of a case of setting a region where the control signal Vin is lower than the voltage (Vout$+\beta$) within a region in which the transistor 341 is in the ON state and where the control signal Vin is higher than the voltage (Vout$-\beta$) within a region where the transistor 342 is in the ON state. In this example, when a difference between the voltage of the control signal Vin and the voltage Vout is within $\beta$ by control of the voltage Vout to follow the control signal Vin, both of the transistors 341 and 342 are in the ON state. Therefore, since a situation in which a current flows relying on the ON state of only one transistor does not occur, the switching of the voltages is performed smoothly and the occurrence of the level difference in the voltage Vout is suppressed. Since a state in which a through-current flows between the wires cannot be avoided by the ON state of both of the transistors 341 and 342, it is disadvantageous in terms of the power consumption.

In FIG. 34B, in a state in which the voltage Vout is equal to or higher than the threshold voltage $(V_1-\alpha)$ less than $(V_1+\alpha)$, and in a state in which a difference between the voltage of the control signal Vin and the voltage Vout is within $\beta$, a total of four of the transistors 341 and 342 of the unit circuit 34a and the transistors 341 and 342 of the unit circuit 34b are in the ON state.

It is preferable that the selection of one of the sets in FIGS. 34A and 34B be performed by taking into account the power consumption, the following property of the voltage Vout, the smooth switching, and the like, comprehensively.

Operation Target

According to the embodiment, an example of the piezoelectric element 40 that discharges ink is described as a drive target of the driver 30. According to the invention, the drive target is not limited to the piezoelectric element 40, but, for example, may be any load which has a capacitive component such as an ultrasonic motor, a touch panel, an electrostatic loudspeaker, or an liquid crystal panel.

The Number of Stages of Unit Circuit or the Like

The embodiment has a configuration in which the six stages of the unit circuits 34a to 34f are provided in ascending order of the voltages to correspond to the adjacent two voltages to each other out of the six types of voltages. However, according to the invention, the number of the unit circuits 34 is not limited thereto as described in Application Example (2), but may be two or more. The greater the number of the unit circuits 34, the less the loss during the charging and discharging, but the more complex the configuration.

In addition, the transistors 341 and 342 in the unit circuit 34 are not limited to the bipolar type, but may be metal-oxide-semiconductor field-effect transistors (MOSFET), respectively.

What is claimed is:

1. A liquid discharge apparatus comprising:
   a piezoelectric element that is displaced according to a voltage of a drive signal;
   a cavity which is filled with a liquid and of which an inside volume is expanded and contracted due to the displacement of the piezoelectric element;
   a nozzle that communicates with the cavity and is capable of discharging the liquid by the expansion and contraction of the inside volume of the cavity;
   a charge source that supplies a charge to the piezoelectric element;
   a first signal path to which a first voltage is applied by the charge source;
   a second signal path to which a second voltage that is higher than the first voltage is applied by the charge source; and
   a connection path selecting section that causes the piezoelectric element and the charge source to be electrically connected to each other by using the first signal path or the second signal path according to the voltage of a control signal that controls the voltage of the drive signal and a hold voltage of the piezoelectric element,
   wherein the charge source includes:
      a first auxiliary power source that outputs two types or more of voltages; and
      a second auxiliary power source that outputs three types or more of voltages which is used to be applied to the piezoelectric element by using the two types or more of voltages output from the first auxiliary power source,
   wherein the first auxiliary power source includes:
      m (m is a plural number) capacitive elements; and
      a first switching section that switches between a series status in which the m capacitive elements are electrically, connected in series and a parallel status in which the m capacitive elements are electrically connected in parallel, and
   wherein the second auxiliary power source includes:
      n (n is a plural number) capacitive elements; and
      a second switching section that switches between a series status in which the n capacitive elements are electrically connected in series and a parallel status in which the n capacitive elements are electrically connected in parallel.

2. The liquid discharge apparatus according to claim 1, wherein, in the second auxiliary power source, in the series status, any first point of connection points of the n capacitive elements to one another is connected to the first signal path and a second point on the higher side than the first point of the connection points of the n capacitive elements to one another is connected to the second signal path.

3. The liquid discharge apparatus according to claim 1, wherein the first auxiliary power source supplies, to the second auxiliary power source, at least one of a higher-side voltage set in which the higher side becomes an A voltage and a lower-side voltage set in which the higher side becomes a B voltage that is lower than the A voltage.

4. The liquid discharge apparatus according to claim 3, wherein the first auxiliary power source supplies, to the second auxiliary power source, the higher-side voltage set in a case where the voltage of the drive signal is a first drive voltage and the lower-side voltage set in a case where the voltage of the drive signal is a second drive voltage which is lower than the first drive voltage.

5. The liquid discharge apparatus according to claim 4, wherein a third drive voltage which is lower than the first drive voltage and higher than the second drive voltage is included both in a voltage range of the higher-side voltage set and in a voltage range of the lower-side voltage set.

6. A head unit comprising:
a piezoelectric element that is displaced according to a voltage of a drive signal;
a cavity which is filled with a liquid and of which an inside volume is expanded and contracted due to the displacement of the piezoelectric element;
a nozzle that communicates with the cavity and is capable of discharging the liquid by the expansion and contraction of the inside volume of the cavity;
a charge source that supplies a charge to the piezoelectric element;
a first signal path to which a first voltage is applied by the charge source;
a second signal path to which a second voltage that is higher than the first voltage is applied by the charge source; and
a connection path selecting section that causes the piezoelectric element and the charge source to be electrically connected to each other by using the first signal path or the second signal path according to the voltage of a control signal that controls the voltage of the drive signal and a hold voltage of the piezoelectric element,
wherein the charge source includes:
a first auxiliary power source that outputs two types or more of voltages; and
a second auxiliary power source that outputs three types or more of voltages in order to apply to the piezoelectric element by using the two types or more of voltages output from the first auxiliary power source,
wherein the first auxiliary power source includes:
m (m is a plural number) capacitive elements; and
a first switching section that switches between a series status in which the m capacitive elements are electrically connected in series and a parallel status in which the m capacitive elements are electrically connected in parallel, and
wherein the second auxiliary power source includes:
n (n is a plural number) capacitive elements; and
a second switching section that switches between a series status in which the n capacitive elements are electrically connected in series and a parallel status in which the n capacitive elements are electrically connected in parallel.

7. A control method of a liquid discharge apparatus that includes:
a piezoelectric element that is displaced according to a voltage of a drive signal;
a cavity which is filled with a liquid and of which an inside volume is expanded and contracted due to the displacement of the piezoelectric element;
a nozzle that communicates with the cavity and is capable of discharging the liquid by the expansion and contraction of the inside volume of the cavity;
a charge source that supplies a charge to the piezoelectric element;
a first signal path to which a first voltage is applied by the charge source; and
a second signal path to which a second voltage that is higher than the first voltage is applied by the charge source,
wherein the charge source includes:
a first auxiliary power source that outputs two types or more of voltages; and
a second auxiliary power source that outputs three types or more of voltages in order to apply to the piezoelectric element by using the two types or more of voltages output from the first auxiliary power source,
wherein the first auxiliary power source includes:
m (m is a plural number) capacitive elements; and
a first switching section that switches between a series status in which the m capacitive elements are electrically connected in series and a parallel status in which the m capacitive elements are electrically connected in parallel, and
wherein the second auxiliary power source includes:
n (n is a plural number) capacitive elements; and
a second switching section that switches between a series status in which the n capacitive elements are electrically connected in series and a parallel status in which the n capacitive elements are electrically connected in parallel,
the method comprising:
causing the piezoelectric element and the charge source to be electrically connected to each other by using the first signal path or the second signal path according to the voltage of a control signal that controls the voltage of the drive signal and a hold voltage of the piezoelectric element.

* * * * *